(12) United States Patent
Okayasu

(10) Patent No.: US 6,549,052 B2
(45) Date of Patent: Apr. 15, 2003

(54) VARIABLE DELAY CIRCUIT

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/771,577

(22) Filed: Jan. 30, 2001

(65) Prior Publication Data

US 2001/0005158 A1 Jun. 28, 2001

Related U.S. Application Data

(63) Continuation of application No. PCT/JP00/04519, filed on Jul. 6, 2000.

(30) Foreign Application Priority Data

Jul. 7, 1999 (JP) .......................................... 11-193774

(51) Int. Cl.$^7$ ............................................... H03H 11/26
(52) U.S. Cl. ...................................... 327/276; 327/277
(58) Field of Search .............................. 327/276, 277, 327/250, 278, 281, 284, 288, 290, 158, 161

(56) References Cited

U.S. PATENT DOCUMENTS

| | | | | |
|---|---|---|---|---|
| 4,922,141 A | * | 5/1990 | Lofgren et al. | ............. 327/250 |
| 5,781,056 A | * | 7/1998 | Fujii | ........................... 327/276 |
| 6,025,745 A | * | 2/2000 | Lee et al. | .................... 327/277 |
| 6,034,558 A | * | 3/2000 | Vanderschoot et al. | ..... 327/277 |
| 6,181,174 B1 | * | 1/2001 | Fujieda et al. | .............. 327/158 |

FOREIGN PATENT DOCUMENTS

| | | |
|---|---|---|
| JP | 61-39722 | 2/1986 |
| JP | 2-141121 | 5/1990 |
| JP | 2-159815 | 6/1990 |
| JP | 5-199088 | 8/1993 |
| JP | 9018304 | 1/1997 |
| JP | 9018305 | 1/1997 |

* cited by examiner

*Primary Examiner*—Timothy P. Callahan
*Assistant Examiner*—Linh Nguyen
(74) *Attorney, Agent, or Firm*—Rosenthal & Osha L.L.P.

(57) ABSTRACT

A variable delay circuit comprises: a delay compensation unit, which has a plurality of referential delay units that include different numbers of first variable delay elements, the delay amount of which varies based on a control signal, the delay compensation unit generates each of a plurality of the control signals, which are provided to the first variable delay elements, according to a number of the first variable delay elements; and a delay unit which generates the desired delay amount by controlling a plurality of second variable delay elements, which have a same characteristic with the first variable delay elements, by the plurality of control signals.

14 Claims, 15 Drawing Sheets

VARIABLE DELAY CIRCUIT

This is a continuation application of PCT/JP00/04519 filed on Jul. 6th, 2000, further of a Japanese patent application, H11-193774 filed on Jul. 7th, 1999, the contents of which are incorporated herein by reference.

FIELD OF THE INVENTION

This invention relates to a variable delay circuit, which generates a delay amount. In particular, this invention relates to a variable delay circuit, which has a plurality of variable delay elements and generates a desired delay amount. Moreover, this invention relates to a Japanese patent application shown below. For the designated state that permits the incorporation of the literature by reference, the contents mentioned in the application shown below are incorporated into the present application to be a part of the contents of the present application.

Japanese patent application H11-193774, filed on Jul. 7th, 1999.

CONVENTIONAL ART

FIG. 1 shows a block diagram of the conventional variable delay circuit 100. The variable delay circuit 100 comprises a micro-variable delay unit 12 and a variable delay unit 14. The micro-variable delay unit 12 has micro-variable delay elements (12a–12n). The variable delay unit 14 has a delay unit (14a–14n). The micro-variable delay elements 12 generate the delay amount, which is smaller than the delay amount generated by the delay unit (14a–14n). Each of the delay units (14a–14n) has a different number of gate circuits 11 and generates a delay amount according to the number of gate circuits 11.

According to the desired delay amount, a delay data, which designates any one of a combination of the micro-variable delay elements (12a–12n) and the delay units (14a–14n), is provided. An input signal is input and is delayed by the delay element selected by the delay data, and a delay signal is output.

FIG. 2(a) is a circuit diagram that shows a drive-impedance-control-type micro-variable delay element 12. In a case where a control signal has a truth value of "0", a drive impedance is set to low. In a case where a control signal has a truth value of "1", a drive impedance is set to high. Therefore, in a case where the control signal has a truth-value of "1", the input signal has a delayed output which is a few more than the case of when the truth value is "0".

FIG. 2(b) is a circuit diagram of a load-capacity-variable-type of micro-variable delay element 12 In a case where a control signal has a truth value of "0", a load capacity is not set, and in a case where a control signal has a truth value of "1", the load capacity is set. Therefore, in a case where the control signal has a truth value of "1", the input signal has a delayed output which is a few more than the case of when the truth value is "0". The variable delay circuit 100 shown in FIG. 1 has a micro-variable delay element 12 shown in FIG. 2(a) and FIG. 2(b) and generates a delay amount in a degree from 10 ps to 100 ps for one micro-variable delay element 12.

FIG. 3 shows a graph for showing the relationship between the delay data, which designates the combination of the delay elements according to the design for generating the desired delay amount, and the delay amount, which is actually generated by the combination of the delay elements set by the delay data. A line "a" shows a straight line, which shows an ideal delay characteristic. In comparison to this, the line "b" generates a delay amount larger than the ideal delay amount. The line "c" generates the delay amount smaller than the ideal delay amount.

Furthermore, the line "b" and the line "c" have a discontinuous part. This is because there are a plurality of different types of the variable delay elements existing in the variable delay circuit 100, and also because the unevenness of the element characteristics and the influence of the change of the ambient temperature do not necessarily match for each type of the variable delay elements.

There is a case that an error is caused on the delay amount, which is generated by the variable delay circuit 100 between the delay amount actually generated by the delay elements and the delay amount according to the design, by such as the unevenness of the element characteristics of the delay elements, a fluctuation of the self-generated heat quantity of the delay element, a fluctuation of the ambient temperature, and a fluctuation of a power supply voltage.

Therefore, it is an object of the present invention to provide a variable delay circuit that can overcome the above issues. This object is achieved by combinations of characteristics described in the independent claims in the scope of the claim of the invention. The dependent claims define further advantageous embodiments of the present invention.

DISCLOSURE OF THE INVENTION

To solve the above object, the first embodiment of the present invention is a variable delay circuit for generating a desired delay amount comprises: a delay compensation unit, which has a plurality of referential delay units that include different numbers of first variable delay elements, the delay amount of which varies based on a control signal, the delay compensation unit generates each of a plurality of the control signals, which are provided to the first variable delay elements included in each of the plurality of referential delay elements, according to a number of the first variable delay elements included in each of the plurality of referential delay units; and a delay unit which generates the desired delay amount by controlling a plurality of second variable delay elements, which have a same characteristic with the first variable delay elements, by the plurality of control signals.

The referential delay unit may include: a first referential delay unit which has M numbers (M is a natural number) of the variable delay elements; a second referential delay unit that has N numbers (N is a natural number) of the first variable delay elements, the numbers of which are different to the numbers of the first variable delay elements included in the first referential delay unit; the delay compensation unit may have: a first delay compensation unit that generates the control signal provided to the first variable delay elements included in the first referential delay unit; and a second delay compensation unit that generates the control signal provided to the first variable delay element included in the second referential delay unit.

The referential delay unit may have a ring oscillator that has different numbers of the first variable delay elements and generates a predetermined period of an oscillation clock according to the numbers of the first variable delay elements.

The delay compensation unit may further have: a phase comparator that compares a phase of a referential clock having a predetermined period with a phase of a delay clock, which is obtained by delaying the referential clock by the first variable delay elements; and a control signal generating unit which generates the control signal based on the comparison.

The control signal generating unit may generate the control signal so that a phase of the referential clock and phase of the delay clock matches.

The variable delay circuit may further comprise a selector that provides any one of a plurality of the control signals provided from the delay compensation unit to the second variable delay elements.

The first variable delay element may have a capacitor that has a predetermined capacitance and a time constant control unit for changing a time constant of the capacitor and may change a delay amount according to the time constant.

The time constant control unit may have a transistor and may change a time constant of the capacitor by changing a gate voltage applied to the transistor.

The second embodiment of the present invention is a variable delay circuit which generates a desired delay amount for a signal to be output to an output terminal that comprises: a variable delay element that has a capacitor having a predetermined capacitance and a time constant control unit, which is serially inserted between the capacitor and the output terminal for changing a time constant of the capacitor, and changes a delay amount according to the time constant; and a delay unit which generates the desired delay amount by selecting the variable delay elements based on the desired delay amount.

The time constant control unit may have a transistor and may change a time constant of the capacitor by changing a gate voltage applied to the transistor.

According to the third embodiment of the present invention, a semiconductor testing apparatus for testing a semiconductor device comprises: a pattern generator for generating a test pattern input to a semiconductor device; a formatted test pattern generator that has: a plurality of referential delay units having different numbers of first variable delay elements, the delay amount of which changes based on a control signal; a delay compensation unit which generates each of a plurality of the control signals provided to the first variable delay elements according to a number of the first variable delay elements; and a delay unit which generates a delay clock having a delay amount according to an operation characteristic of the semiconductor device by controlling a plurality of second variable delay elements having a same characteristic with that of the first variable delay elements by the plurality of control signals; the formatted test pattern generator formats the test pattern based on the delay clock and generates a formatted test pattern; a device contact unit, on which the semiconductor device is installed, for inputting the formatted test pattern to the semiconductor device; and a comparator which judges the quality of the semiconductor device based on an output signal output from the semiconductor device, to which the formatted test pattern is input.

The referential delay unit may have a ring oscillator that has different numbers of the first variable delay element and may generate a predetermined period of an oscillation clock according to the numbers of the first variable delay elements.

The variable delay circuit may further have a selector that provides any one of a plurality of the control signals provided from the delay compensation unit to the second variable delay elements.

The first variable delay element may have a capacitor that has a predetermined capacitance and a time constant control unit for changing a time constant of the capacitor and may change a delay amount according to the time constant.

According to the fourth embodiment of the present invention, a semiconductor device having a semiconductor test unit for testing a semiconductor device comprises: a semiconductor test unit which has: a plurality of referential delay units having different numbers of first variable delay elements, the delay amount of which changes based on a control signal; a delay compensation unit which generates each of a plurality of the control signals provided to the first variable delay elements according to the numbers of the first variable delay elements; a delay unit which generates a timing used for testing a device-under-test unit based on an operation characteristic of the semiconductor device by controlling a plurality of second variable delay elements having a same characteristic with that of the first variable delay elements by the plurality of control signals; and a device-under-test unit to be tested by the semiconductor test unit.

The referential delay unit may have a ring oscillator that has different numbers of the first variable delay elements and generates a predetermined period of an oscillation clock according to the numbers of the first variable delay elements.

The variable delay circuit may further comprise a selector that provides any one of a plurality of the control signals provided from the delay compensation unit to the second variable delay elements.

The first variable delay element may have a capacitor having a predetermined capacitance and a time constant control unit for changing a time constant of the capacitor and may change a delay amount according to the time constant.

According to the fifth embodiment of the present invention, a delay signal generating method for generating a delay signal, which is obtained by delaying an input signal for a desired time, comprises: a step for generating a plurality of clocks by a plurality of referential delay units having different numbers of first variable delay elements, the delay amount of which changes, based on a control signal; a step for comparing each of the phases of a plurality of the clocks and a phase of a referential clock; a step for correcting each of the control signals corresponding to a plurality of the clocks based on the compared phase; a step for controlling each of the delay amounts of the first variable delay elements based on the corrected control signal; and a step for generating the delay signal, which is obtained by delaying the input signal for the desired time by controlling a plurality of second variable delay elements, which receives the control signal and is controlled based on the control signal and has a same characteristic with that of the first variable delay element, based on the corrected control signal.

EXPLANATION FOR REFERENCE NUMERALS

10 . . . delay unit, 2 . . . variable delay element, 14 . . . variable delay unit, 20 . . . delay compensation unit, 22 . . . phase comparator, 24 . . . control signal generating unit, 26 . . . referential delay unit, 28 . . . voltage-control-type variable delay element, 36 . . . flip flop, 38 . . . delay element, 40 . . . AND circuit, 42 . . . FET, 44 . . . FET, 46 . . . capacitor, 48 . . . differential amplifier circuit, 52 . . . differential amplifier circuit, 54 . . . delay compensation unit, 56 . . . referential delay unit, 58 . . . phase comparator, 60 . . . control signal generating unit, 62 . . . delay compensation unit, 64 . . . phase comparator, 66 . . . control signal generating unit, 68 . . . referential delay unit, 71 . . . micro-variable delay unit, 72 . . . voltage/load capacity-control-type variable delay element, 73 . . . variable delay unit, 74 . . . drive-impedance-control-type variable delay element, 75 . . . capacity load unit, 76 . . . time constant control unit, 77 . . . voltage-control-type variable delay unit, 79 . . . capacity load switching unit, 80 . . . delay compensation unit, 81 . . . micro-variable delay unit, 82 . . . ring oscillator, 83 . . . variable delay unit, 84 . . . phase comparator, 86 . . . control signal generating unit, 88 . . . selector, 90 . . . pattern generator, 92 . . . formatted pattern generator, 93 . . . device-under-test, 94 . . . device contact unit, 95 . . . comparator, 96 . . . semiconductor device, 98 . . . device-under-test, 100 . . . variable delay apparatus

THE BEST MODE FOR EMBODYING THE PRESENT INVENTION

The invention will now be described based on the preferred embodiments, and the following embodiments do not intend to limit the scope of the claim of the present invention, and all of the features and the combinations thereof described in the embodiments are not necessarily essential to the solution of the invention.

Figure 1:
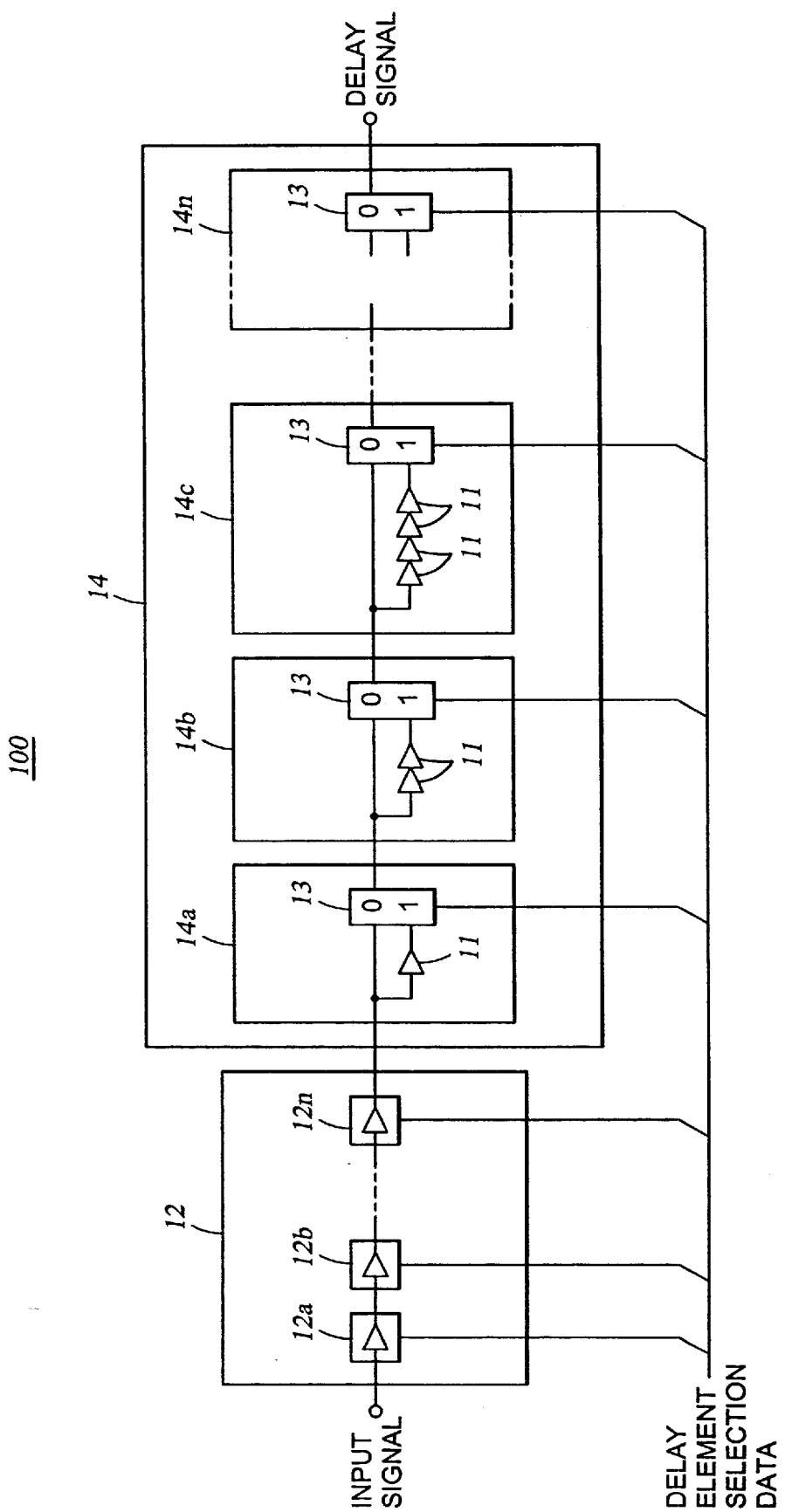
FIG. 1 shows a conventional variable delay circuit 100.
Figure 2B:
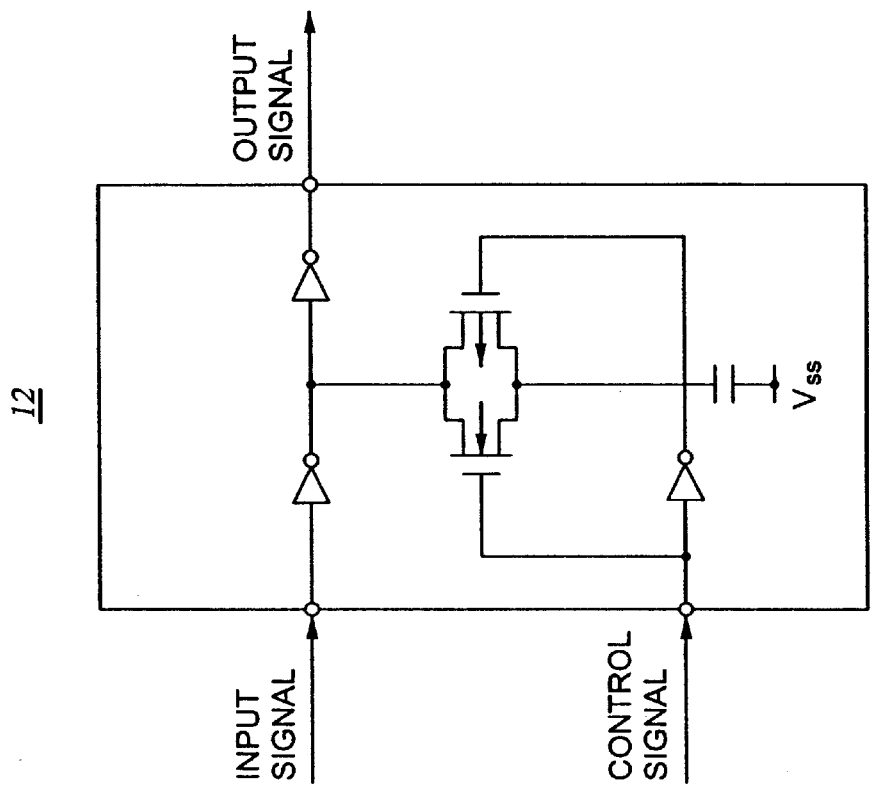
FIG. 2 shows a micro-variable delay element 12.
Figure 2A:
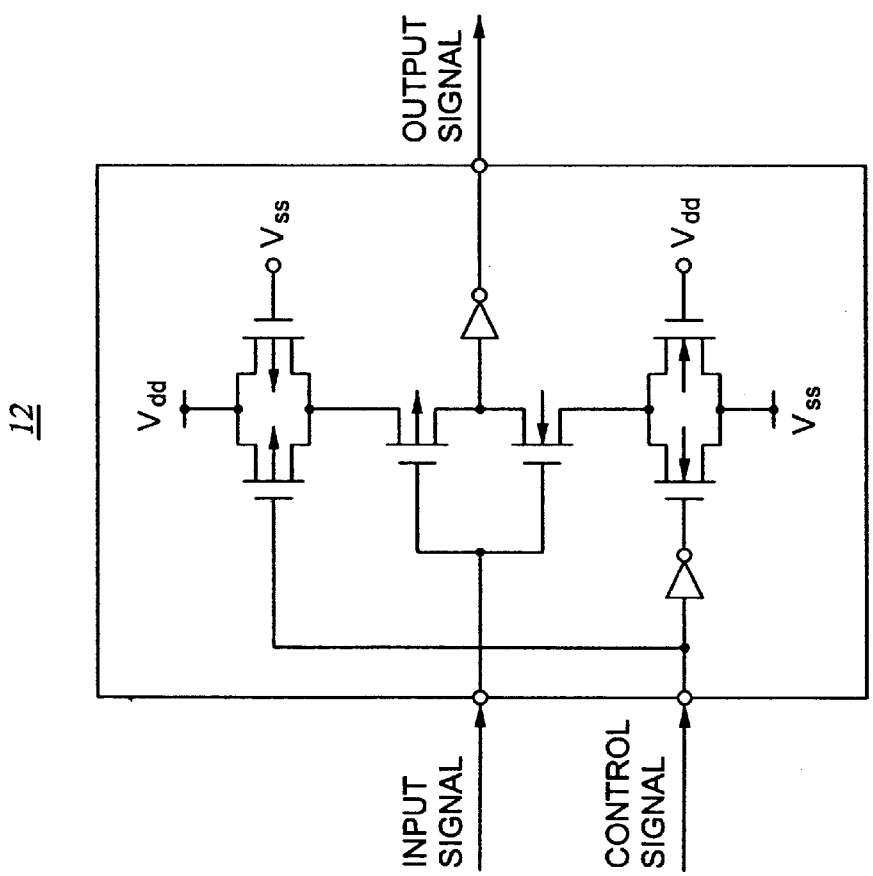
Figure 3:
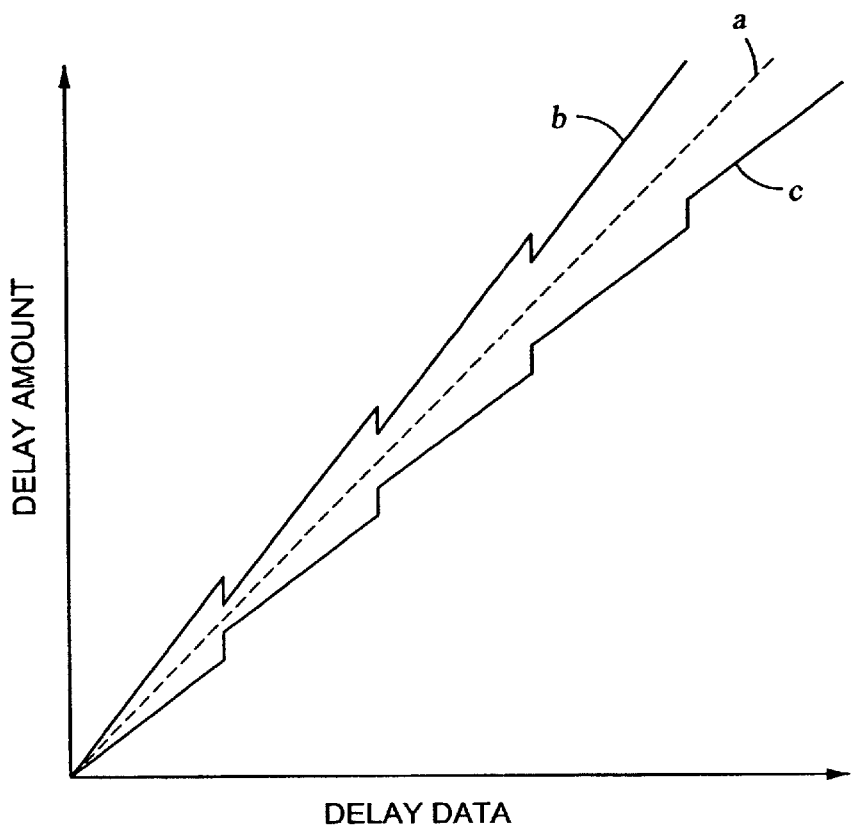
FIG. 3 is a graph for showing the relationship of the delay amount actually generated against the delay data.
Figure 4:
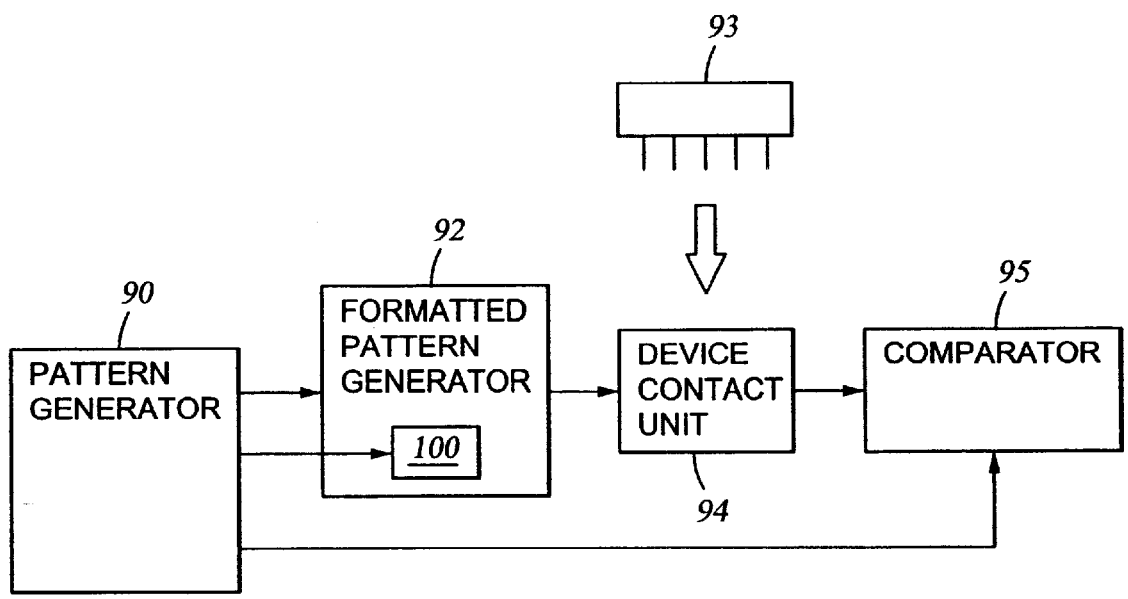
FIG. 4 is a block diagram of a semiconductor testing apparatus.

FIG. 4 is a block diagram that shows one of the embodiments of a semiconductor testing apparatus. The semiconductor testing apparatus comprises a pattern generator 90, a formatted pattern generator 92, a device contact unit 94, and a comparator 95. The formatted pattern generator 92 has a variable delay circuit 100.

The device-under-test 93 contacts with the semiconductor testing apparatus electrically at the device contact unit 94. The pattern generator 90 generates a pattern data, which is a test pattern to be input to the device-under-test 93, and an expectation value data, which is to be output from the device-under-test 93 by inputting the pattern data. The pattern generator 90 outputs the pattern data to the formatted pattern generator 92 and outputs the expectation value data to the comparator 95. Furthermore, the pattern generator 90 outputs a timing set signal, which designates the generation of the delay clock having a predetermined delay amount corresponding to an operation characteristic of the device-under-test 93, to the variable delay circuit 100.

The variable delay circuit 100 generates a delay clock having a delay amount designated by the timing set signal. The formatted pattern generator 92 formats the pattern data based on the delay clock provided from the variable delay circuit 100 and outputs the formatted pattern data, which is corresponded to the operation characteristic of the device-under-test 93, to the device contact unit 94. The device-under-test 93 outputs the output value, which is corresponded to the formatted pattern data, to the comparator 95 via the device contact unit 94. The device-under-test 93 may be packaged or provided on a wafer. The comparator 95 compares the output value and the expectation value data provided from the pattern generator 90 and judges the quality of the device-under-test 93.

Figure 5:
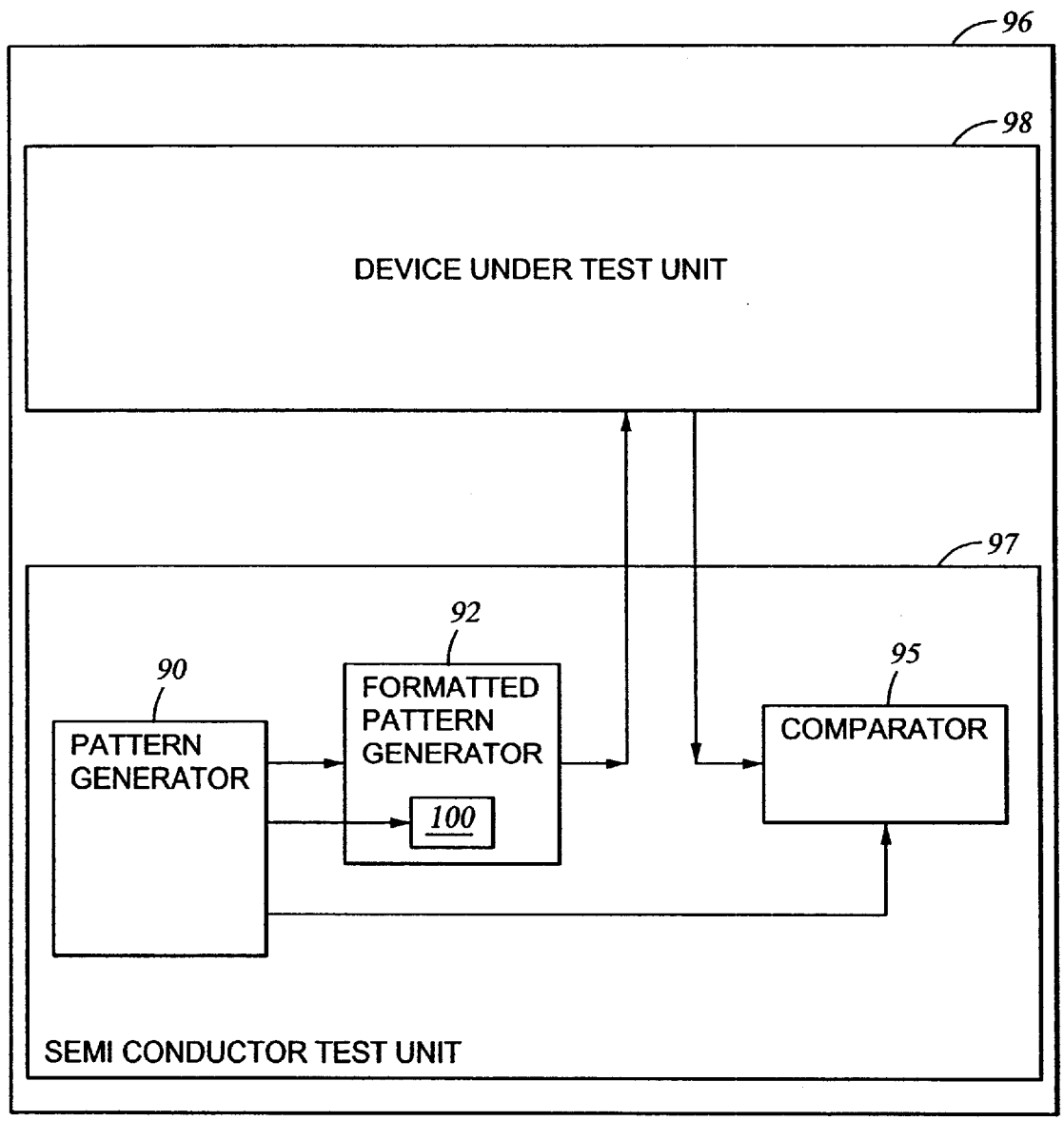
FIG. 5 shows a semiconductor device 96 having a semiconductor test unit 97 for testing a device-under-test unit 98.

FIG. 5 shows a semiconductor device 96 having a semiconductor test unit 97 for testing a semiconductor device. The semiconductor device 96 comprises a semiconductor test unit 97 and a device-under-test unit 98.

The semiconductor test unit 97 is comprised of a pattern generator 90, a formatted pattern generator 92, and a comparator 95. The formatted pattern generator 92 has a variable delay circuit 100.

The pattern generator 90 generates a pattern data, which is a test pattern to be input to the device-under-test unit 98, and the expectation value data, which is to be output from the device-under-test unit 98 by inputting the pattern data. The pattern generator 90 outputs the pattern data to the formatted pattern generator 92 and outputs the expectation value data to the comparator 95. Furthermore, the pattern generator 90 outputs a timing set signal, which designates the generation of the delay clock having a predetermined delay amount corresponding to the operation characteristic of the device-under-test unit 98, to the variable delay circuit 100.

The variable delay circuit 100 generates a delay clock having a delay amount designated by the timing set signal. The formatted pattern generator 92 formats the pattern data based on the delay clock provided from the variable delay circuit 100 and outputs the formatted pattern data that corresponds to the operation characteristic of the device-under-test unit 98 to the device-under-test unit 98. The device-under-test unit 98 outputs the output value that corresponds to the formatted pattern data to the comparator 95. The comparator 95 compares the output value and the expectation value data provided from the pattern generator 90 and judges the quality of the device-under-test unit 98.

Figure 6:
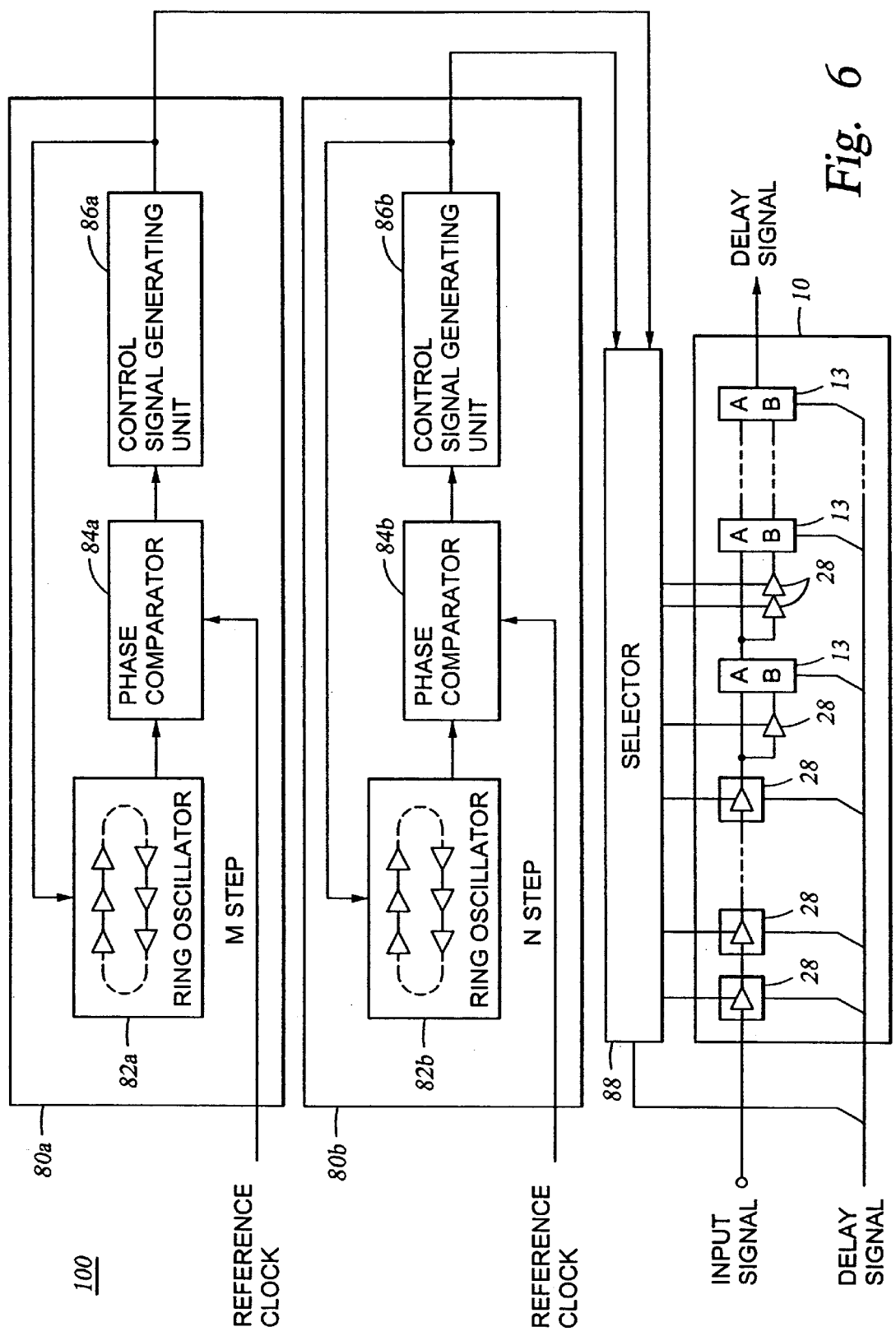
FIG. 6 is a block diagram that shows one of the embodiments of the variable delay circuit 100.

FIG. 6 is a block diagram that shows one of the embodiments of the variable delay circuit 100. The variable delay circuit 100 comprises a first delay compensation unit 80*a*, a second delay compensation unit 80*b*, a selector 88, and a delay unit 10. The first delay compensation unit 80*a* has a first ring oscillator 82*a*, a phase comparator 84*a*, and a control signal generating unit 86*a*. The second delay compensation unit 80*b* has a second ring oscillator 82*b*, a phase comparator 84*b*, and a control signal generating unit 86*b*.

The first ring oscillator 82*a* has M numbers (M is a natural number) of the voltage-control-type variable delay element 28, the delay amount of which changes based on the control signal. The second ring oscillator 82*b* has N numbers (N is a natural number) of the voltage-control-type variable delay elements 28, the number of which is different to the number of the voltage-control-type variable delay elements 28 included in the first ring oscillator 82a. The delay unit 10 comprises a plurality of selectors 13 and a plurality of voltage-control-type variable delay elements 28, which have the same characteristics with the voltage-control-type variable delay elements 28 included in the first ring oscillator 82a and the second ring oscillator 82b. For example, it is preferable to form the variable delay circuit 100 in the same semiconductor device.

In the first delay compensation unit 80a, the first ring oscillator 82a generates a first period of a first oscillation clock and outputs to the phase comparator 84. The period of the first oscillation clock is set based on the first control signal that controls the delay amount. The phase comparator 84 compares the phase of the first oscillation clock and the phase of the referential clock, having a predetermined period, and outputs the comparison result. For example, the phase comparator 84 may output the phase difference between the first oscillation clock and the referential clock, which is the comparison result, as a voltage value. The control signal generating unit 86a generates the first control signal based on the comparison result provided from the phase comparator 84a and provides to the first ring oscillator 82a and the selector 88.

The control signal generating unit 86a may generate the first control signal so that the phase of the first oscillation clock matches the phase of the referential clock. Therefore, for example, if the period of the referential clock is T, the control signal generating unit 86a generates the first control signal so that each voltage-control-type variable delay elements 28 included in the first ring oscillator 82a generates a delay amount of T/M. Moreover, in the other embodiment, the control signal generating unit 86a may generate the first control signal so that the phase of the clock obtained by dividing the frequency of the referential clock and the phase of the first oscillation clock matches.

In the second delay compensation unit 80b, because the second ring oscillator 82b has N numbers (N is a natural number) of the voltage-control-type variable delay elements 28, for example, if the period of a referential clock is T, the control signal generating unit 86b generates the second control signal so that each of the voltage-control-type variable delay elements 28 included in the second ring oscillator 82b generate the delay amount of T/N. Because the function and the operation of the second ring oscillator 82b, the phase comparator 84b, and the control signal generating unit 86b included in the second delay compensation unit 80b are the same as the function and the operation of the first ring oscillator 82a, the phase comparator 84a, and the control signal generating unit 86a included in the first delay compensation unit 80a, the explanations of which are abbreviated.

The selector 88 provides either the first control signal or the second control signal to each of the voltage-control-type variable delay elements 28 included in the delay unit 10 based on the delay data that designates the combination of the delay elements. Because the voltage-control-type variable delay elements 28 included in the delay unit 10 has the same characteristics as that of the voltage-control-type variable delay elements 28 included in the first ring oscillator 82a and the second ring oscillator 82b, if the first control signal is provided, a delay amount of T/M can be generated. Moreover, if the second control signal is provided, a delay amount of T/N can be generated.

Figure 7:
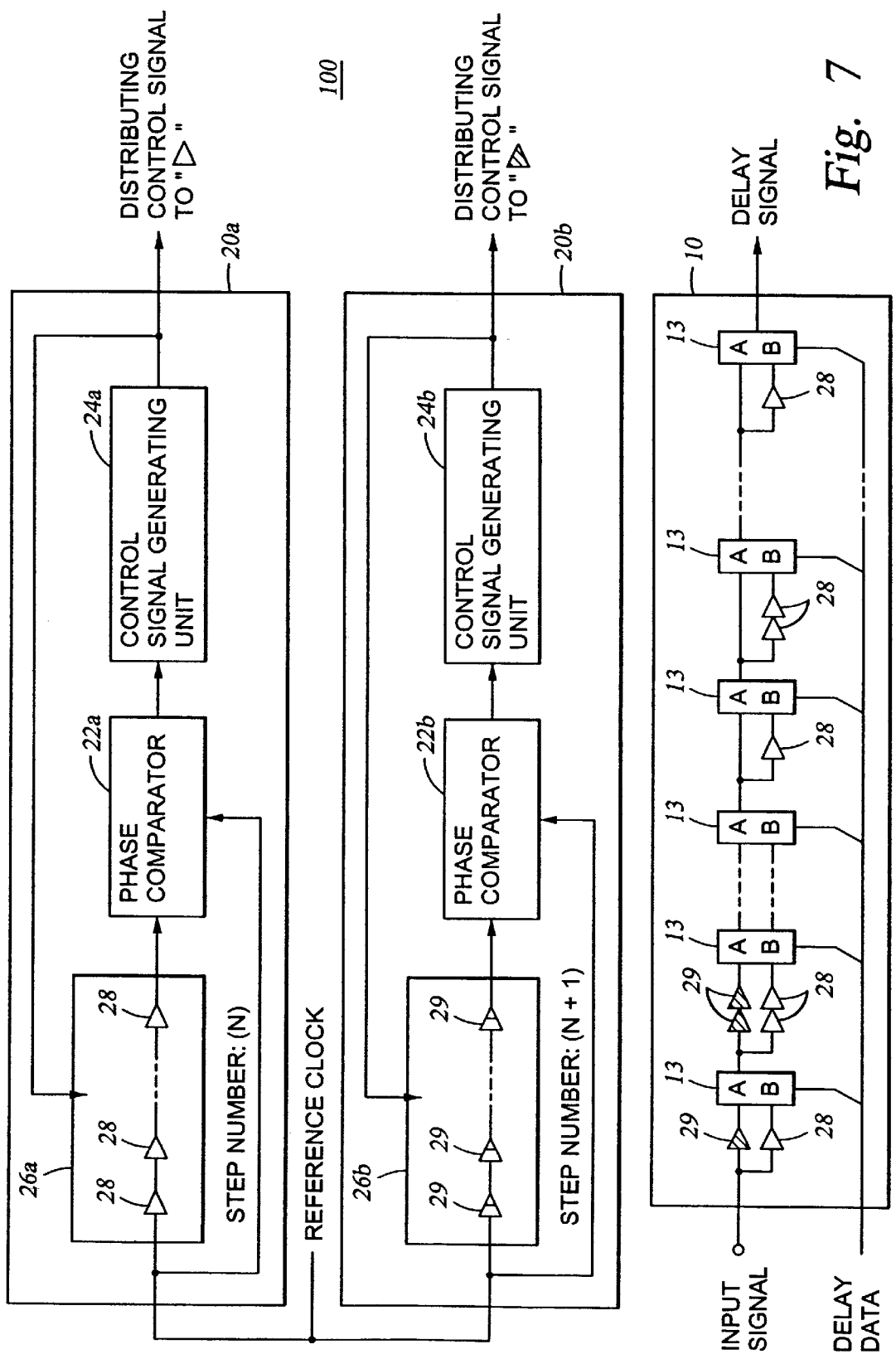
FIG. 7 is a block diagram that shows one of the embodiments of the variable delay circuit 100.

FIG. 7 is a block diagram that shows one of the embodiments of the variable delay circuit 100. The variable delay circuit 100 comprises a first delay compensation unit 20a, a second delay compensation unit 20b, and a delay unit 10. The first delay compensation unit 20a has a first referential delay unit 26a, a phase comparator 22a, and a control signal generating unit 24a. The second delay compensation unit 20b has a second referential delay unit 26b, a phase comparator 22b, and a control signal generating unit 24b.

The first referential delay unit 26a has N numbers (N is a natural number) of voltage-control-type variable delay elements 28, the delay amount of which changes based on the first control signal generated by the first delay compensation unit 20a. The second referential delay unit 26b has (N+1) numbers (N is a natural number) of voltage-control-type variable delay elements 29, the delay amount of which changes based on the second control signal generated by the second delay compensation unit 20b. The voltage-control-type variable delay element 28 and the voltage-control-type variable delay element 29 have the same configuration and characteristics, and only the provided control signal is different. Each of the first referential delay unit 26a and the second referential delay unit 26b preferably has different numbers of voltage-control-type variable delay elements. The delay unit 10 has a plurality of voltage-control-type variable delay elements (28 and 29), which have the same characteristics as that of the voltage-control-type variable delay elements 28 included in the first referential delay unit 26a and the second referential delay unit 26b, and has a plurality of selectors 13. For example, the variable delay circuit 100 is preferably formed in the same semiconductor device.

In the delay compensation unit 20a, the first referential delay unit 26a generates a first delay clock by delaying a referential clock, which has a predetermined period, using the N numbers (N is a natural number) of the voltage-control-type variable delay elements 28 and outputs to the phase comparator 22a. The phase comparator 22a compares the phase of the referential clock and the phase of the first delay clock and outputs the comparison result to the control signal generating unit 24a.

The control signal generating unit 24a generates a first control signal, which changes the delay amount generated by the voltage-control-type variable delay element 28, based on the comparison result of the phase comparator 22a and provides to the first referential delay unit 26a and the delay unit 10. For example, if the period of the referential clock is T, the control signal generating unit 24a generates the first control signal so that each of the voltage-control-type variable delay elements 28 generate the delay amount of T/N. Moreover, in the other embodiments, the control signal generating unit 24a may generate the first control signal so that the phase of the clock obtained by dividing the frequency of the referential clock and the phase of the first delay clock matches.

In the second delay compensation unit 20b, because the second referential delay unit 26b has (N+1) numbers (N is a natural number) of the voltage-control-type variable delay elements 29, for example, if the period of the referential clock is T, the control signal generating unit 24b generates the second control signal so that each of the voltage-control-type variable delay elements 29 generate the delay amount of T/(N+1). Because the function and the operation of the second referential delay unit 26b, the phase comparator 22b, and the control signal generating unit 24b included in the second delay compensation unit 20b are the same as the function and the operation of the first referential delay unit 26a, the phase comparator 22a, and the control signal generating unit 24a included in the first delay compensation unit 20a, the explanations of which are abbreviated.

The delay unit 10 selects any one of the voltage-control-type variable delay elements 28 or the voltage-control-type variable delay elements 29 based on the delay data that designates the combination of the delay elements for generating a desired delay amount and delays an input signal. In the other embodiments, the variable delay circuit 100 may have a selector for distributing a plurality of control signals for setting a predetermined delay amount to the voltage-control-type variable delay elements 28 and may distribute a control voltage, which is provided to the voltage-control-type variable delay elements 28, based on the desired delay amount to be generated by the delay unit 10.

Figure 8:
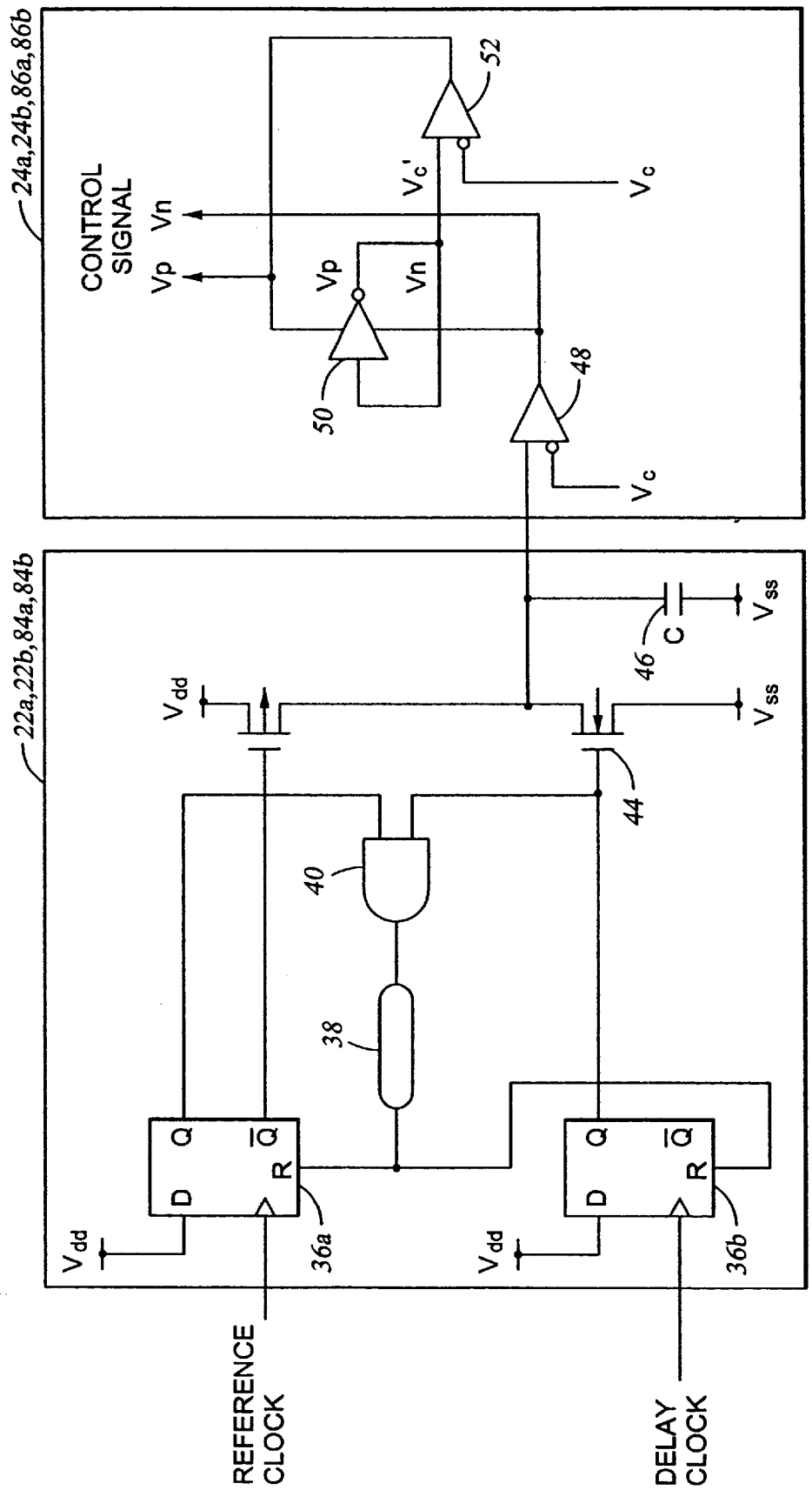
FIG. 8 is a circuit diagram of the phase comparator 22a and the control signal generating unit 24a included in the variable delay circuit 100 explained using FIG. 6 and FIG. 7.

FIG. 8 is a block diagram that shows one of the embodiments of the phase comparator (22a, 22b, 84a, and 84b) and the control signal generating unit (24a, 24b, 86a, and 86b) included in the variable delay circuit 100 explained using FIG. 6 and FIG. 7. Because the configuration and the operation of the phase comparators (22a, 22b, 84a, and 84b) and the control signal generating units (24a, 24b, 86a, and 86b) are the same, the phase comparator 22a and the control signal generating unit 24a are used as explanations.

The phase comparators 22a and 22b comprise flip flops 36a and 36b, a delay element 38, an AND circuit 40, a FET 42, a FET 44, and a capacitor 46. The control signal generating unit 24a and 24b comprise a differential amplifier circuit 48, a logical-threshold-value voltage generating unit 50, and a differential amplifier circuit 52.

The flip flop 36a outputs a truth value of "1" from a terminal Q to the AND circuit 40 based on the positive power supply voltage Vdd, which is input to a terminal D, at a rise timing of the pulse of the referential clock. Moreover, the flip flop 36b outputs the logical value of "0" from the inversion output terminal Q to the FET 42. The FET 42 opens the gate while the truth value of "0" is provided from the flip flop 36a and outputs the positive power supply voltage Vdd to the capacitor 46.

The flip flop 36b outputs the truth value of "1" from the terminal Q to the AND circuit 40 and the FET 44 based on the positive power supply voltage Vdd, which is input to the terminal D, at the rise timing of the pulse of the delay clock provided from the first referential delay unit 26a. The FET 44 opens the gate while the truth value of "1" is provided from the flip flop 36b and outputs the negative power supply voltage Vss to the capacitor 46.

The AND circuit 40 outputs the logical multiplication of the truth values, which are provided from the terminal Q of the flip flop 36a and the terminal Q of the flip flop 36b, to the delay element 38. The delay element 38 delays the pulse, which is shown by the truth value of "1" provided from the AND circuit 40, for a predetermined amount and outputs to the reset terminal R of the flip flop 36a and the flip flop 36b. Therefore, the capacitor 46 generates the electric potential, which shows the phase difference between the referential clock and the delay clock.

The differential amplifier circuit 48 amplifies the potential difference between the electric potential of the capacitor 46 and the referential potential Vc and generates a control signal Vn, which changes the delay amount of the voltage-control-type variable delay element 28, and outputs to the logical-threshold-value voltage generating unit 50 and the voltage-control-type variable delay element 28 explained using FIG. 6 and FIG. 7. In the present embodiment, the delay amount of the voltage-control-type variable delay element 28 is determined by two control signals of the control signal Vn and the control signal Vp.

The referential potential Vc is preferably a logical threshold voltage of the voltage-control-type variable delay element 28, which is determined by the control signal Vn, the control signal Vp, the threshold voltage of the FET, and the ratio of the drain current coefficient. For example, because the logical threshold voltage of the usual CMOS gate is in the vicinity of the midpoint of the positive power supply voltage Vdd and the negative power supply voltage Vss, the referential potential Vc may be a midway potential of the positive power supply voltage Vdd and the negative power supply voltage Vss.

The logical-threshold-value voltage generating unit 50 may be the voltage-control-type variable delay element 28 explained using FIG. 6 and FIG. 7, and generates the logical threshold voltage Vc', which is a voltage when the control signal Vp and the control signal Vn are provided, and output to the differential amplifier circuit 52.

The differential amplifier circuit 52 amplifies the potential difference between the midway potential Vc and the logical threshold voltage Vc' and performs the negative feedback control and outputs the control signal Vp to the logical-threshold-value voltage generating unit 50 and the voltage-control-type variable delay element 28 explained using FIG. 6 and FIG. 7 so that the midway potential Vc becomes equal to the logical threshold voltage Vc'.

Figure 9B:
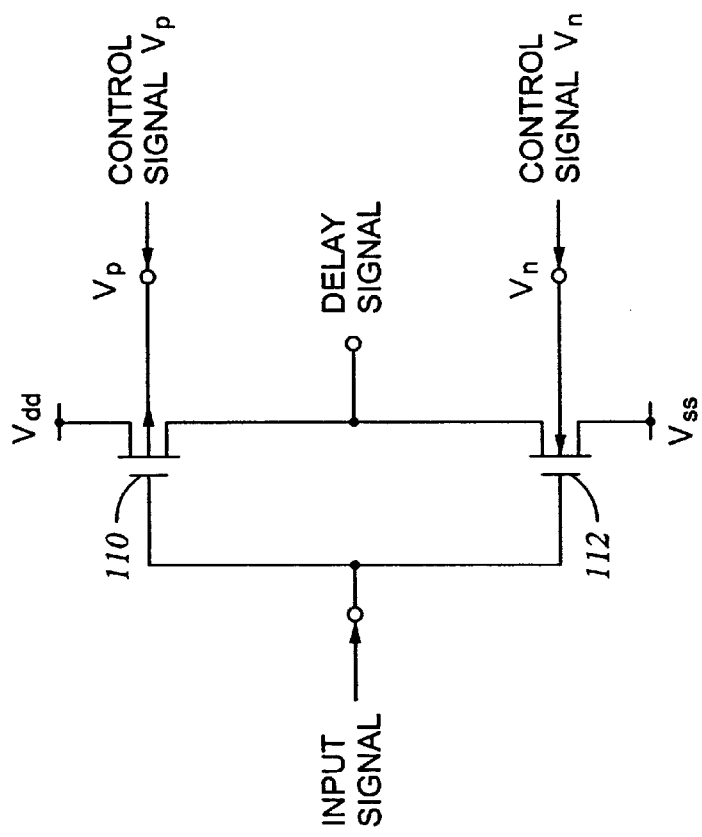
FIG. 9 shows a circuit diagram of the voltage-control-type variable delay element 28.
Figure 9A:
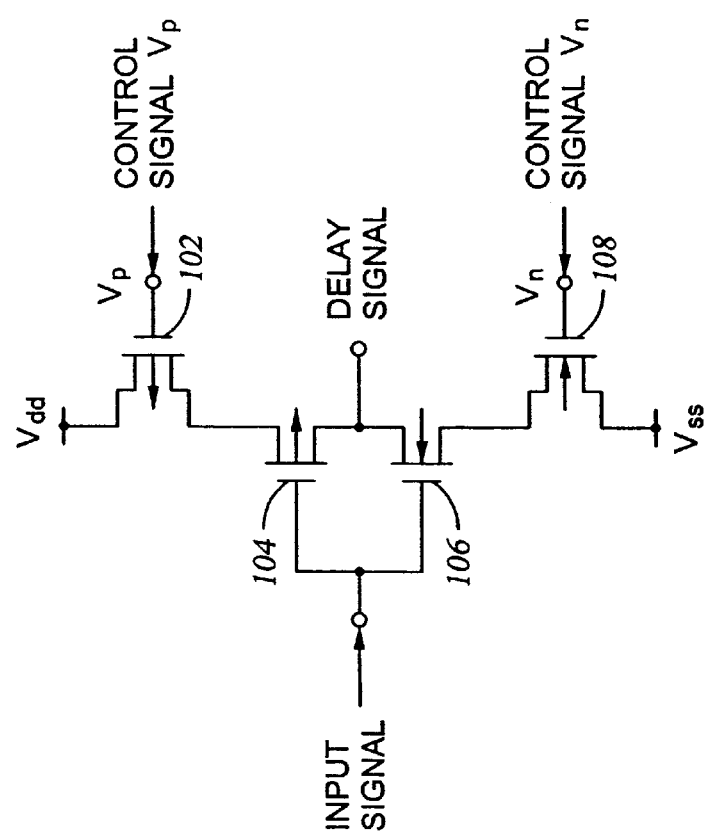

FIG. 9(a) shows a circuit diagram of the voltage-control-type variable delay elements 28 and 29 included in the variable delay circuit 100 explained using FIG. 6 and FIG. 7. In the figure, Vdd is a positive power supply voltage, and Vss is a negative power supply voltage. The voltage-control-type variable delay elements 28 and 29 have transistors (102, 104, 106, and 108). The transistor 102 changes the impedance between the source and the drain based on the electric potential of the control signal Vp provided to the terminal Vp. The transistor 108 changes the impedance between the source and the drain based on the electric potential of the control signal Vn provided to the terminal Vn. For example, the transistor may be a CMOS.

The voltage-control-type variable delay elements 28 and 29 change the delay amount to be generated based on the control signal Vp and the control signal Vn. With a decrease of the electric potential of the control signal Vp, and/or an increase of the electric potential of the control signal Vn, the delay amount generated by the voltage-control-type variable delay elements 28 and 29 decreases. In contrast, with an increase of the electric potential of the control signal Vp, and/or a decrease of the electric potential of the control signal Vn, the delay amount generated by the voltage-control-type variable delay element 28 and 29 increases.

FIG. 9(b) shows a circuit diagram of the voltage-control-type variable delay elements 28 and 29 included in the variable delay circuit 100 explained using FIG. 6 and FIG. 7. In the figure, Vdd is a positive power supply voltage, and Vss is a negative power supply voltage. The Control signal Vp is input to the control terminal Vp, and the control signal Vn is input to the control terminal Vn. The voltage-control-type variable delay element 28 has transistors (110 and 112). The transistor 110 changes the impedance between the source and the drain based on the electric potential of the control signal Vp provided to the terminal Vp. The transistor 112 changes the impedance between the source and the drain based on the electric potential of the control signal Vn provided to the terminal Vn. For example, the transistor may be a CMOS.

The voltage-control-type variable delay elements 28 and 29 change the delay amount to be generated based on the control signal Vp and the control signal Vn. With a decrease of the electric potential of the control signal Vp, and/or an increase of the electric potential of the control signal Vn, the delay amount generated by the voltage-control-type variable delay elements 28 and 29 decreases. In contrast, with an increase of the electric potential of the control signal Vp, and/or a decrease of the electric potential of the control signal Vn, the delay amount generated by the voltage-control-type variable delay elements 28 and 29 increases.

Figure 10:
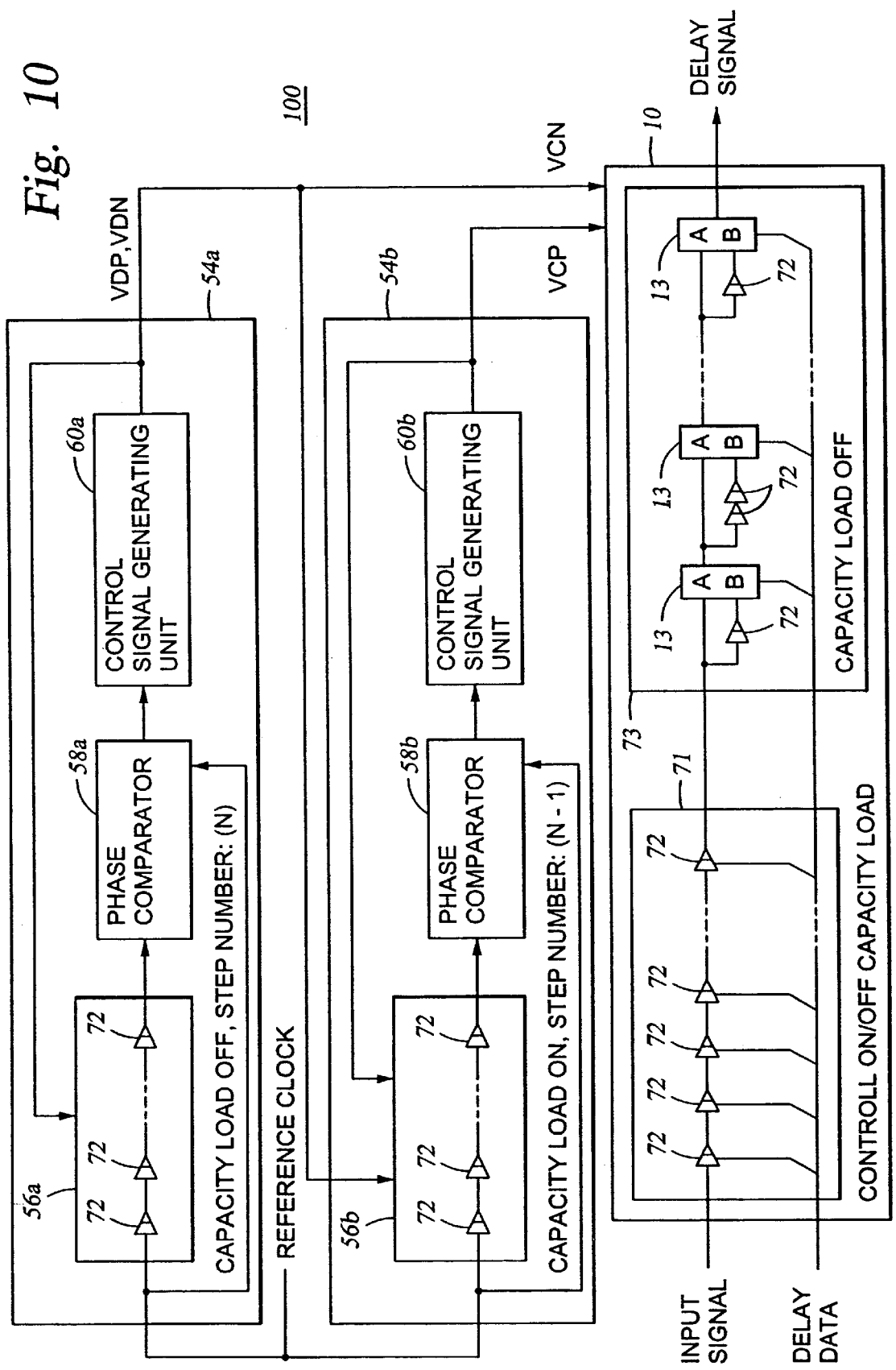
FIG. 10 is a block diagram that shows one of the embodiments of a variable delay circuit 100.

FIG. 10 is a block diagram that shows one of the embodiments of a variable delay circuit 100. The variable delay circuit 100 comprises a first delay compensation unit 54a, a second delay compensation unit 54b, and a delay unit 10. The first delay compensation unit 54a has a first referential delay unit 56a, a phase comparator 58a, and a control signal generating unit 60a. The second delay compensation unit 54b has a second referential delay unit 56b, a phase comparator 58b, and a control signal generating unit 60b.

The first referential delay unit 56a has M numbers (M is a natural number) of voltage/load capacity-control-type variable delay elements 72, which change a delay amount using a drive impedance and a load capacitance. The second referential delay unit 56b has N numbers (N is a natural number) of voltage/load capacity-control-type variable delay elements 72, the numbers of which are fewer than that of the voltage/load capacity-control-type variable delay element 72 included in the first referential delay unit 56a.

In the present embodiment, the delay amount of the voltage/load capacity-control-type variable delay element 72 is determined by a control signal VDP and a control signal VDN, which control a drive impedance, and by a capacity load control signal VCP and a capacity load signal VCN, which control a capacity load.

The delay unit 10 has a micro-variable delay unit 71 and a variable delay unit 73. The micro-variable delay unit 71 and the variable delay unit 73 have a plurality of voltage/load capacity-control-type variable delay elements 72, which have the same characteristics with the voltage/load capacity-control-type variable delay elements 72 included in the first referential delay unit 26a and the second referential delay unit 26b. For example, the variable delay circuit 100 is preferably formed in the same semiconductor device. Furthermore, the variable delay unit 73 has a plurality of selectors 13.

In the first delay compensation unit 54a, the voltage/load capacity-control-type variable delay element 72 included in the first referential delay unit 56a is set to a condition without using a capacity load. The first referential delay unit 56a delays a referential clock having a predetermined frequency by the M numbers of the voltage/load capacity-control-type variable delay elements 72 and outputs the delay clock to the phase comparator 58a. The phase comparator 58a compares the phase of the referential clock and the phase of the delay clock and outputs the comparison result to the control signal generating unit 60a.

The control signal generating unit 60a generates the control signal VDP and the control signal VDN based on the comparison result provided from the phase comparator 58a and outputs to the first referential delay unit 56a and the second referential delay unit 56b. Moreover, in the other embodiments, the control signal generating unit 60a may generate the control signal VDP and the control signal VDN so that the phase of the clock, which is obtained by dividing the referential clock, and the phase of the delay clock matches.

In the second delay compensation unit 54b, the voltage/load capacity-control-type variable delay elements 72 included in the second referential delay unit 56b are set to a condition of using a capacity load, and the control signal VDP and the control signal VDN are provided from the first delay compensation unit 54a. The second referential delay unit 56b delays the referential clock by the N numbers of the voltage/load capacity-control-type variable delay elements 72 and outputs the delay clock to the phase comparator 58b. The phase comparator 58b compares the phase of the referential clock with the phase of the delay clock and outputs the comparison signal to the control signal generating unit 60b. The control signal generating unit 60b generates a capacity load control signal VCP and a capacity load control signal VCN based on the comparison result provided from the phase comparator 58b and outputs to the second referential delay unit 56b. Moreover, in the other embodiments, the control signal generating unit 60b may generate the capacity load control signal VCP and the capacity load control signal VCN so that the phase of the clock obtained by dividing the referential clock and the phase of the delay clock matches.

For example, in a case where the first referential delay unit 56a has N numbers (N is a natural number) of the voltage/load capacity-control-type variable delay elements 72, and the second referential delay unit 56b has N−1 numbers of the voltage/load capacity-control-type variable delay elements 72, and if the period of the referential clock is T, the first delay compensation unit 54a generates the control signal VDP and the control signal VDN so that each of the voltage/load capacity-control-type variable delay elements 72 generates the delay amount of T/N in the condition without using the capacity load.

In the second delay compensation unit 54b, each of the voltage/load capacity-control-type variable delay elements 72 generate the delay amount of T/(N−1). Because the control signal VDP and the control signal VDN are provided from the first delay compensation unit 54a to the N−1 numbers of the voltage/load capacity-control-type variable delay elements 72, the second delay compensation unit 54b generates the capacity load control signal VCP and the capacity load control signal VCN so that the delay amount of:

$$T/(N-1)-T/N=T/N/(N-1)$$

is set by the capacity load. The control signal VDP, the control signal VDN, the capacity load control signal VCP, and the capacity load control signal VCN generated by the first delay compensation unit 54a and the second delay compensation unit 54b are provided to the voltage/load capacity-control-type variable delay elements 72 included in the delay unit 10.

The delay unit 10 sets whether to use the capacity load of the voltage/load capacity-control-type variable delay elements 72 included in the micro-variable delay unit 71 based on the delay data that designates the combination of the delay elements for generating a desired delay amount. Moreover, the delay unit 10 generates a delay amount of an integer multiple of the delay amount of each of the voltage/load capacity-control-type variable delay elements 72 by the combination of the voltage/load capacity-control-type variable delay elements 72 included in the variable delay unit 73.

For example, in a case where the period of the referential clock is T, and the first referential delay unit 56a has N numbers of the voltage/load capacity-control-type variable delay elements 72, and the second referential delay unit 56b has N−1 numbers of the voltage/load capacity-control-type variable delay elements 72, each of the plurality of the voltage/load capacity-control-type variable delay elements 72 included in the micro-variable delay unit 71 can vary the delay amount for only:

$$T/(N-1)-T/N=T/N/(N-1)$$

depending on whether the capacity load is used or not. The variable delay unit 73 can generate the delay amount of an integer multiple of the delay amount of T/N in the condition of not using the capacity load. Furthermore, in the other embodiment, the delay amount of the integer multiple of the delay amount of T/(N−1) may be generated by using the capacity load. Furthermore, in the other embodiments, the variable delay circuit 100 may have a selector, which distributes a plurality of control signals for setting a predetermined delay amount to the voltage/load capacity-control-type variable delay elements 72, and distribute a control voltage, which is provided to the voltage/load capacity-control-type variable delay elements 72 based on the desired delay amount to be generated in the delay unit 10.

Figure 11A:
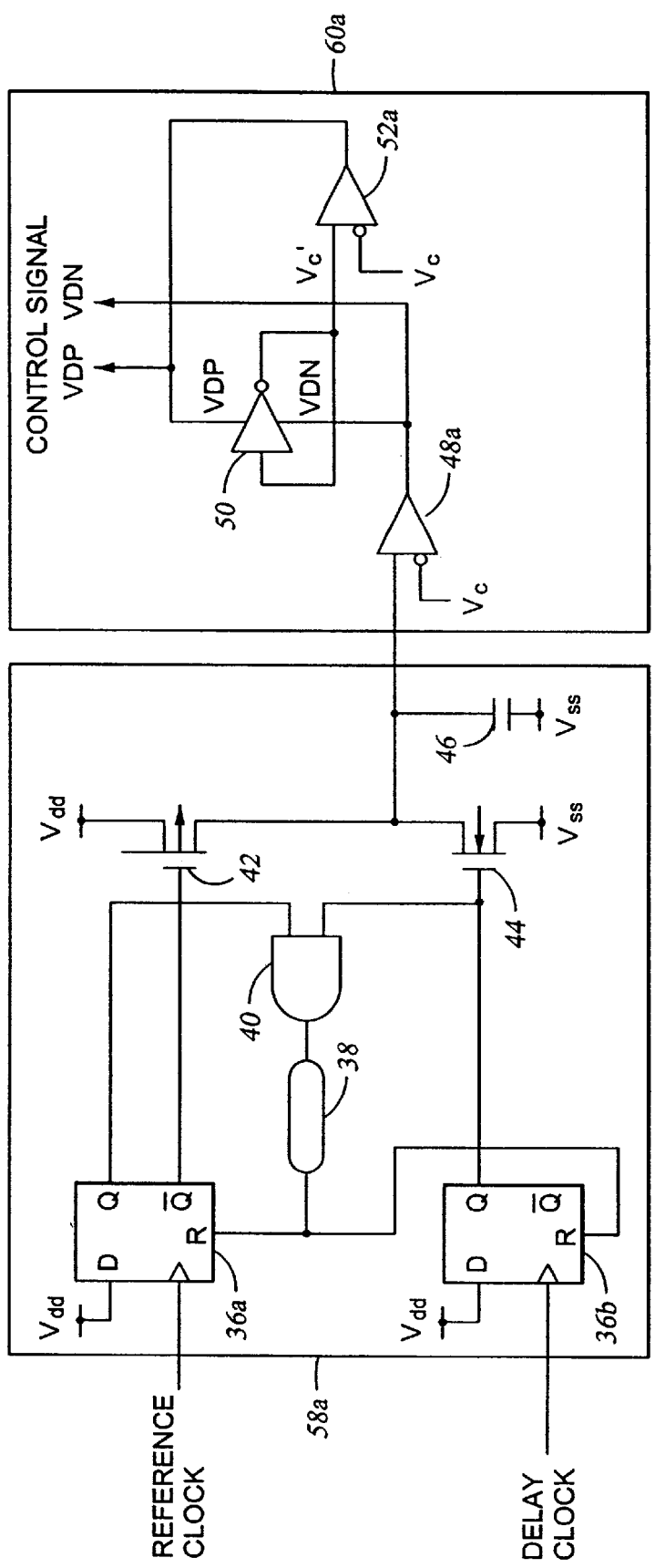
FIG. 11 shows a circuit diagram of the phase comparator 58*a* and the control signal generating unit 60*a* included in the variable delay circuit 100 explained using FIG. 10.

FIG. 11(a) is a figure that shows a circuit diagram of the phase comparator 58a and the control signal generating unit 60a explained using FIG. 10. The explanation of the phase comparator 58a is abbreviated because the phase comparator 58a has a same configuration with that of the phase comparator 22a explained using FIG. 8 and has the same function and operation. The differential amplifier circuit 48a outputs the control signal VDN, which is obtained by amplifying the potential difference between the electric potential of the capacitor 46 that shows the phase difference between the referential clock and the delay clock and the referential potential Vc, to the logical-threshold-value voltage generating unit 50 and the voltage/load capacity-control-type variable delay elements 72 included in the variable delay circuit 100 explained using FIG. 10.

The logical-threshold-value voltage generating unit 50 generates a logical threshold value voltage Vc', which is a voltage when the control signal VDN and the control signal VDP are provided, and output to the differential amplifier circuit 52a. The differential amplifier circuit 52a amplifies the potential difference between the logical threshold value voltage Vc' and the referential potential Vc and performs a negative feedback control and outputs the control signal VDP to the logical-threshold-value voltage generating unit 50 and the voltage/load capacity-control-type variable delay elements 72 included in the variable delay circuit 100 explained using FIG. 10 so that the midway potential Vc and the logical threshold value voltage Vc' becomes equal.

Figures 11B, 11C:
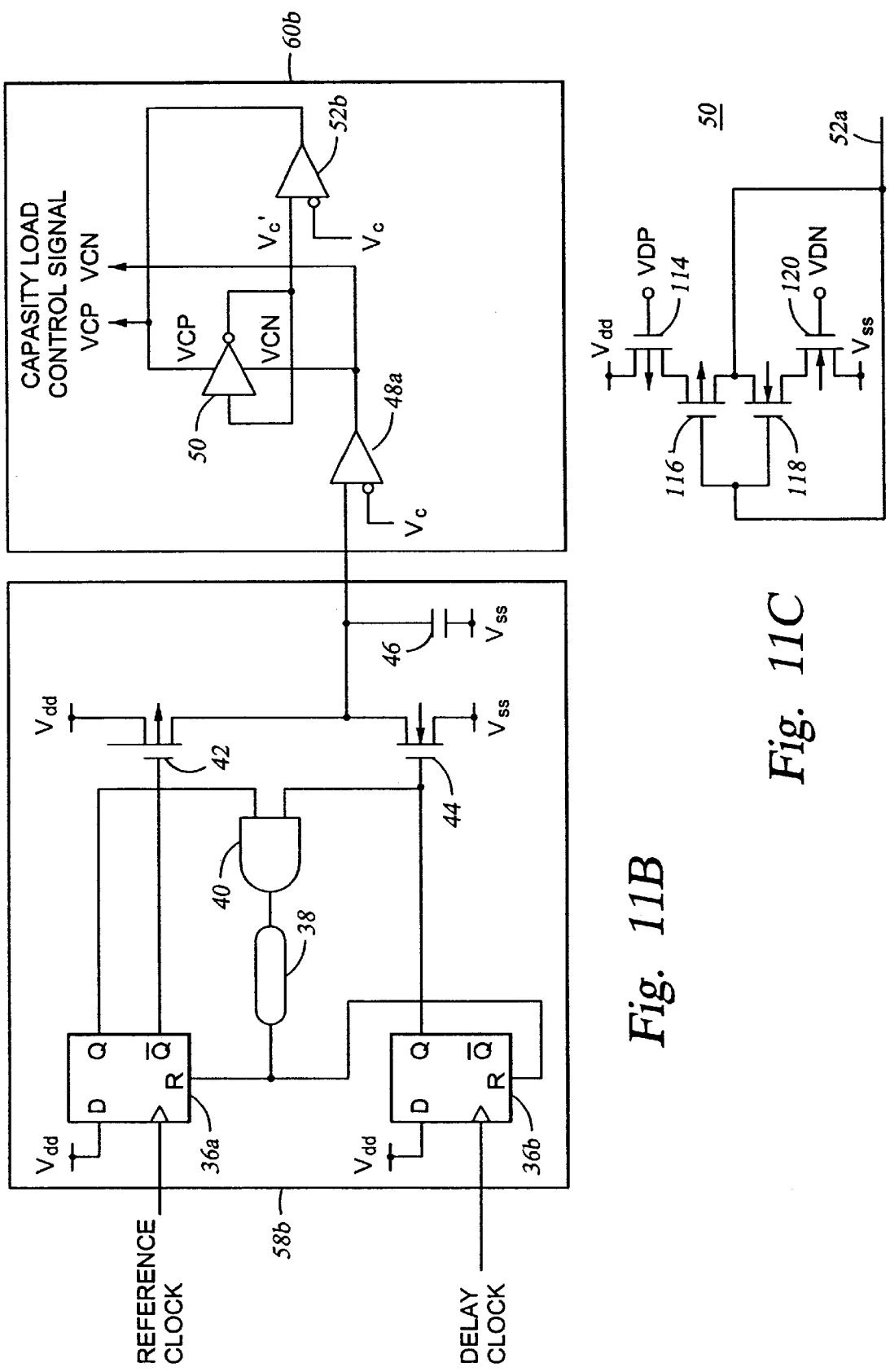

FIG. 11(b) is a figure that shows a circuit diagram of the phase comparator 58b and the control signal generating unit 60b explained using FIG. 10. The explanation of the phase comparator 58b is abbreviated because the phase comparator 58b has a same configuration with that of the phase comparator 22a explained using FIG. 8 and has the same function and operation. The differential amplifier circuit 48a outputs the capacity load control signal VCN, which is obtained by amplifying the potential difference between the electric potential of the capacitor 46 that shows the phase difference between the referential clock and the delay clock and the referential potential Vc, to the logical-threshold-value voltage generating unit 50 and the voltage/load capacity-control-type variable delay elements 72 included in the variable delay circuit 100 explained using FIG. 10.

The logical-threshold-value voltage generating unit 50 generates a logical threshold value voltage Vc', which is a voltage when the capacity load control signal VCN and the capacity load control signal VCP are provided, and outputs to the differential amplifier circuit 52b. The differential amplifier circuit 52b amplifies the potential difference between the logical threshold value voltage Vc' and the referential potential Vc, performs a negative feedback control, generates the capacity load control signal VCP so that the midway potential Vc and the logical threshold value voltage Vc' becomes equal, and outputs to the voltage/load capacity-control-type variable delay elements 72b.

FIG. 11(c) is a figure that shows a circuit diagram of the logical-threshold-value voltage generating unit 50 included in FIG. 11(a). The logical-threshold-value voltage generating unit 50 is an inversion gate and preferably has a same characteristic with the inversion gate included in the voltage/load capacity-control-type variable delay element 72. The logical-threshold-value voltage generating unit 50 has transistors (114, 116, 118, and 120). The transistor 114 changes impedance between a drain and a source based on the electric potential of the control signal VDN provided to a gate terminal. The transistor 120 changes impedance between a drain and a source based on the electric potential of the control signal VDP provided to a gate terminal. Moreover, the output value of the inversion gate is fedback. The logical-threshold-value voltage generating unit 50 included in FIG. 11(b) is preferably the same circuit as the inversion gate explained using FIG. 11(c). In a case where the transistor 114 is used as a logical-threshold-value voltage generating unit 50 shown in FIG. 11(b), the transistor 114 changes impedance between a drain and a source based on the electric potential of the capacity load control signal VCN provided to the gate terminal. The transistor 120 changes impedance between a drain and a source based on the electric potential of the capacity load control signal VCP provided to the gate terminal.

Figure 12:
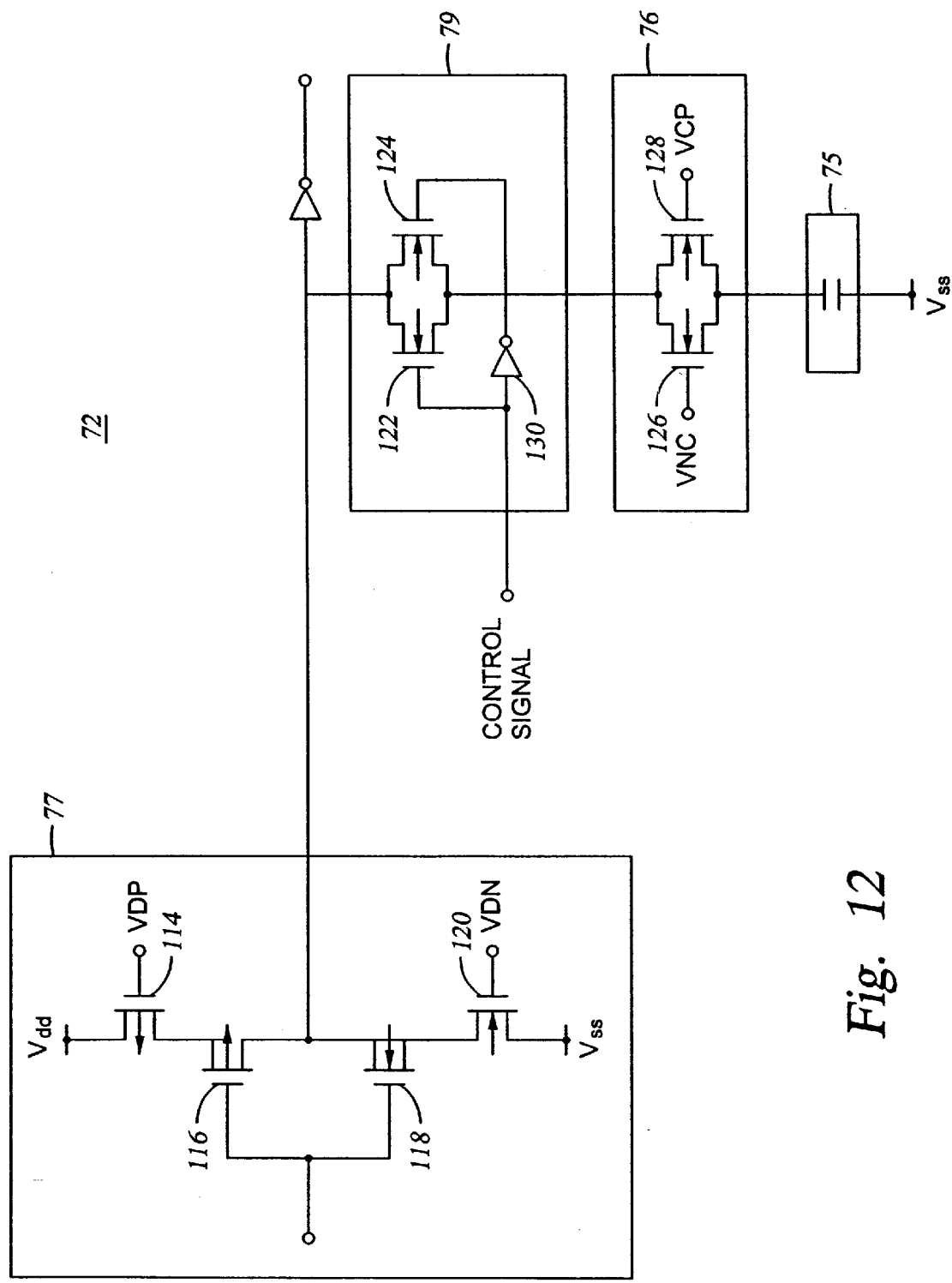
FIG. 12 shows a circuit diagram of the voltage/load capacity-control-type variable delay element 72.

FIG. 12 shows a circuit diagram of the voltage/load capacity-control-type variable delay element 72 included in the variable delay circuit 100 explained using FIG. 10. The voltage/load capacity-control-type variable delay element 72 has a voltage-control-type variable delay unit 77, a time constant control unit 76, a capacity load switching unit 79, and a capacitor 75. The voltage-control-type variable delay unit 77 has transistors (114, 116, 118, and 120). The capacity load switching unit 79 has an inverter 130, and transistors (122 and 124). The time constant control unit 76 has transistors (126 and 128).

Because the voltage-control-type variable delay unit 77 has a same configuration and operation with that of the voltage-control-type variable delay element 28 explained using FIG. 9, the explanation of which is abbreviated. The capacity load switching unit 79 switches using the capacity load or not using the capacity load based on the truth value provided to the terminal CONT. In a case where the capacity load is used, the truth value of "1" is provided to the terminal CONT. In a case where the capacity load is not used, the truth value of "0" is provided to the terminal CONT.

The time constant control unit 76 changes a time constant of the capacitor 75. Moreover, the time constant control unit 76 is preferably serially inserted between the capacitor 75 and the output terminal of the voltage/load capacity-control-type variable delay element 72. In the present embodiment, the time constant control unit 76 has transistors (126 and 128).

In the time constant control unit 76, the transistor 126 changes an impedance between a drain and a source based on the electric potential of the capacity load control signal VCN provided to the gate terminal. The transistor 128 changes impedance between a drain and a source based on the electric potential of the capacity load control signal VCP provided to the gate terminal. For example, the transistors (126 and 128) may be a CMOS of an N channel and a P channel. For example, with an increase of the electric potential of the capacity load control signal VCN, and/or a decrease of the electric potential of the capacity load control signal VCP, the impedance decreases, and the delay amount generated by the capacity load increases.

Moreover, with a decrease of the electric potential of the capacity load control signal VCN, and/or an increase of the electric potential of the capacity load control signal VCP, the impedance increases, and the delay amount generated by the capacity load decreases. The capacitor 75 has a predetermined capacitance. The voltage/load capacity-control-type variable delay element 72 generates a delay amount by the impedance of the time constant control unit 76 and the capacitance of the capacitor 75.

Figure 13:
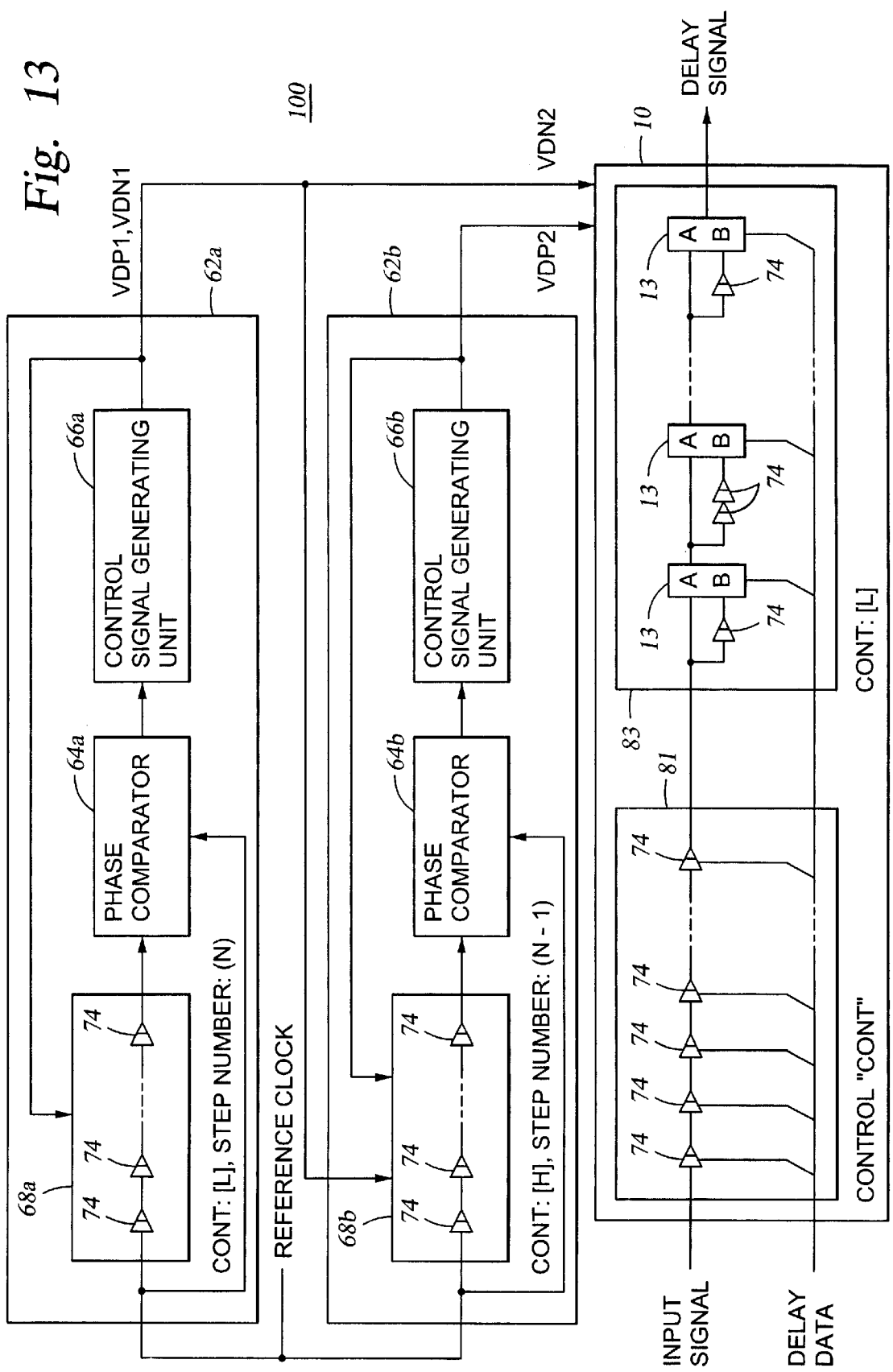
FIG. 13 is a block diagram that shows one of the embodiments of the variable delay circuit 100.

FIG. 13 is a block diagram that shows one of the embodiments of the variable delay circuit 100. The variable delay circuit 100 comprises a first delay compensation unit 62a, a second delay compensation unit 62b, and a delay unit 10. The first delay compensation unit 62a has a first referential delay unit 68a, a phase comparator 64a, and a control signal generating unit 66a. The second delay compensation unit 62a has a second referential delay unit 68b, a phase comparator 64b, and a control signal generating unit 66b.

The first referential delay unit 68a has M numbers (M is a natural number) of drive-impedance-control-type variable delay elements 74 that change a delay amount by changing a drive impedance. The second referential delay unit 68b has N numbers (N is a natural number) of the drive-impedance-control-type variable delay elements 74, the number of which is different to that of the first referential delay units 68.

The delay unit 10 has a micro-variable delay unit 81 and a variable delay unit 83. The micro-variable delay unit 81 and the variable delay unit 83 have a plurality of the drive-impedance-control-type variable delay elements 74, which have a same characteristic with that of the drive-impedance-control-type variable delay elements 74 included in the first referential delay unit 68a and the second referential delay unit 68b. For example, the variable delay circuit 100 is preferably generated in the same semiconductor device. Furthermore, the variable delay unit 83 has a plurality of selectors 13.

In the present embodiment, the delay amount of the drive-impedance-control-type variable delay element 74 is determined by a control signal VDN1, a control signal VDP1, a control signal VDN2, and a control signal VDP2 that control a drive impedance.

In the first delay compensation unit 62a, the first referential delay unit 68a delays a referential clock by the N numbers of the drive-impedance-control-type variable delay elements 74 and generates a delay clock. The phase comparator 64a compares the phase of the referential clock having a predetermined period and the phase of the delay clock and outputs the comparison result to the control signal generating unit 66a. The control signal generating unit 66a generates the control signal VDP1 and the control signal VDN1 based on the comparison result provided from the phase comparator 64a.

In the second delay compensation unit 62b, the second referential delay unit 68b delays a referential clock by the M numbers of the drive-impedance-control-type variable delay elements 74 and generates a delay clock. The phase comparator 64b compares the phase of the referential clock and the phase of the delay clock and outputs the comparison result to the control signal generating unit 66b. The control signal generating unit 66b generates the control signal VDP2 and the control signal VDN2 based on the comparison result provided from the phase comparator 64b. Moreover, in the other embodiment, the control signal generating unit 66a and the control signal generating unit 66b may generate the control signal VDN1, the control signal VDP1, the control signal VDN2, and the control signal VDP2 so that the phase of the clock obtained by dividing the frequency of the referential clock and the phase of the delay clock matches.

The delay unit 10 changes the delay amount of the drive-impedance-control-type variable delay elements 74 included in the micro-variable delay unit 81 based on the delay data that designates the combination of the delay elements for generating a desired delay amount. Moreover, an input signal is delayed by the combination of the drive-impedance-control-type variable delay elements 74 included in the variable delay unit 83.

The micro-variable delay unit 81 switches to any one of the control signal VDP1 and the control signal VDN1 provided from the first delay compensation unit 62a and the control signal VDP2 and the control signal VDN2 provided from the second delay compensation unit 62b to generate a micro-delay amount.

The variable delay unit 83 generates the delay amount of integer multiple of T/M by the control signal VDP1 and the control signal VDN1 provided from the first delay compensation unit 62a. In the other embodiment, the variable delay unit 83 may generate the delay amount of an integer multiple of T/N by the control signal VDP2 and the control signal VDN2 provided from the second delay compensation unit 62b. Furthermore, in the other embodiment, the variable delay circuit 100 may have a selector that distributes a plurality of control signals for generating a predetermined delay amount to the drive-impedance-control-type variable delay elements 74 and may distribute the control signal, which is provided to the drive-impedance-control-type variable delay elements 74, based on the desired delay amount to be generated by the delay unit 10.

Figure 14:
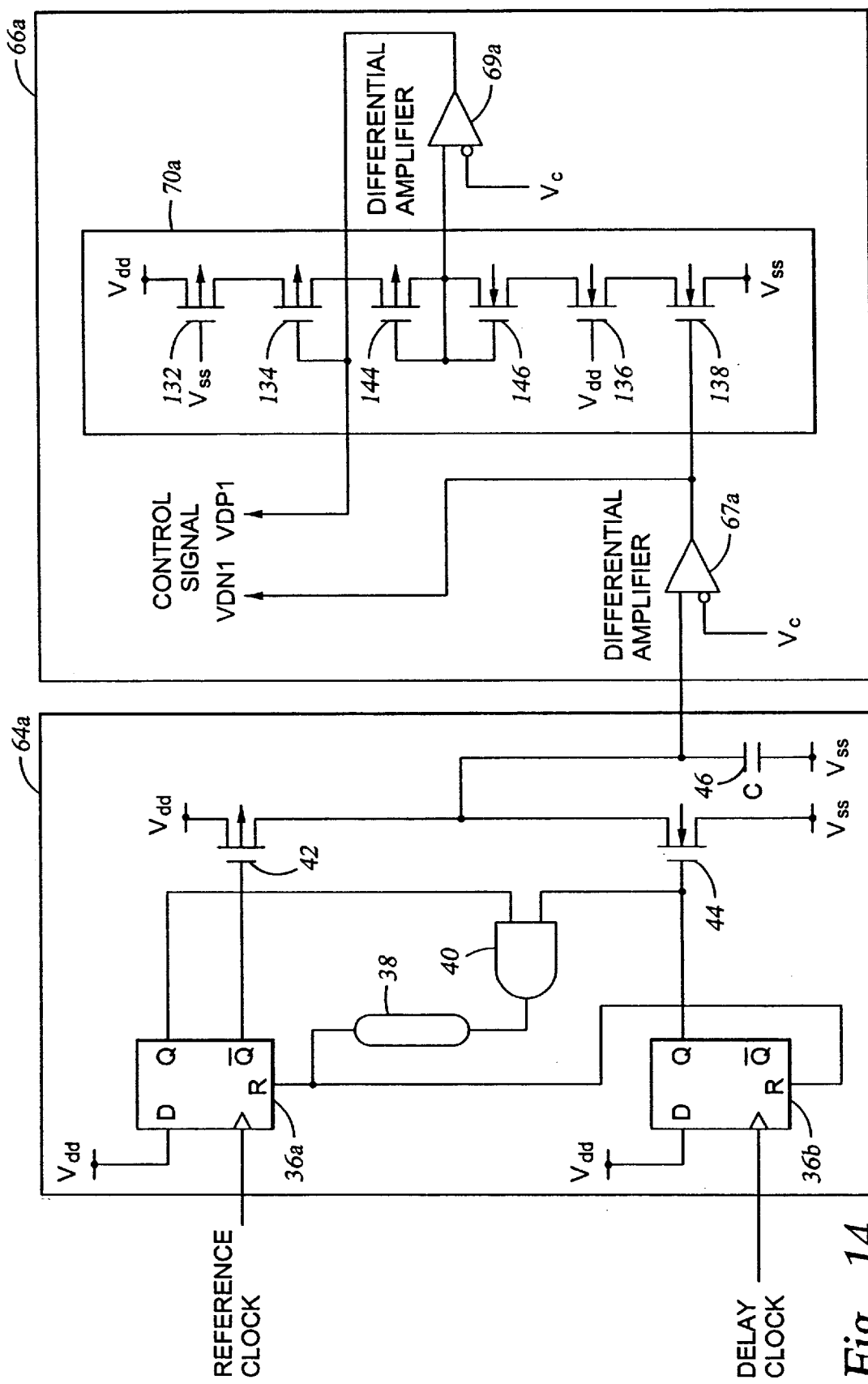
FIG. 14 shows a circuit diagram of the phase comparator 64*a* and the control signal generating unit 66*a* included in the variable delay circuit 100 explained using FIG. 13.

FIG. 14 shows a circuit diagram of the phase comparator 64a and the control signal generating unit 66a included in the variable delay circuit 100 explained using FIG. 13. Because the configuration and the operation of the phase comparator 64a are same as the configuration and the operation of the phase comparator 22a explained using FIG. 8, the explanation of which is abbreviated. The control signal generating unit 66a has a differential amplifier circuit 67a, a logical-threshold-value voltage generating unit 70a, and a differential amplifier circuit 69a. The logical-threshold-value voltage generating unit 70a has transistors (132, 134, 144, 146, 136, and 138).

The differential amplifier circuit 67a amplifies the potential difference between the electric potential of the capacitor 46, which shows the phase difference between the referential clock and the delay clock, and the referential potential Vc and generates the control signal VDN1.

The logical-threshold-value voltage generating unit 70a generates the logical threshold value voltage Vc', which is a voltage when the control signal VDN1 and the control signal VDN2 are provided. The logical-threshold-value voltage generating unit 70a may be in a condition of inputting a truth value of "0" into the terminal CONT of the drive-impedance-control-type variable delay element 74 (refer to FIG. 15) and preferably has the same transistors.

The differential amplifier circuit 69a amplifies the potential difference between the logical threshold value voltage Vc', which is provided from the logical-threshold-value voltage generating unit 70a, and the referential voltage Vc and generates the control signal VDP1. Because the phase comparator 64b and the control signal generating unit 66b included in the variable delay circuit 100 explainedusing FIG. 13 have a same configuration and operation as that of the phase comparator 64a and the control signal generating unit 66a explained using FIG. 14, the explanation of which is abbreviated.

Figure 15:
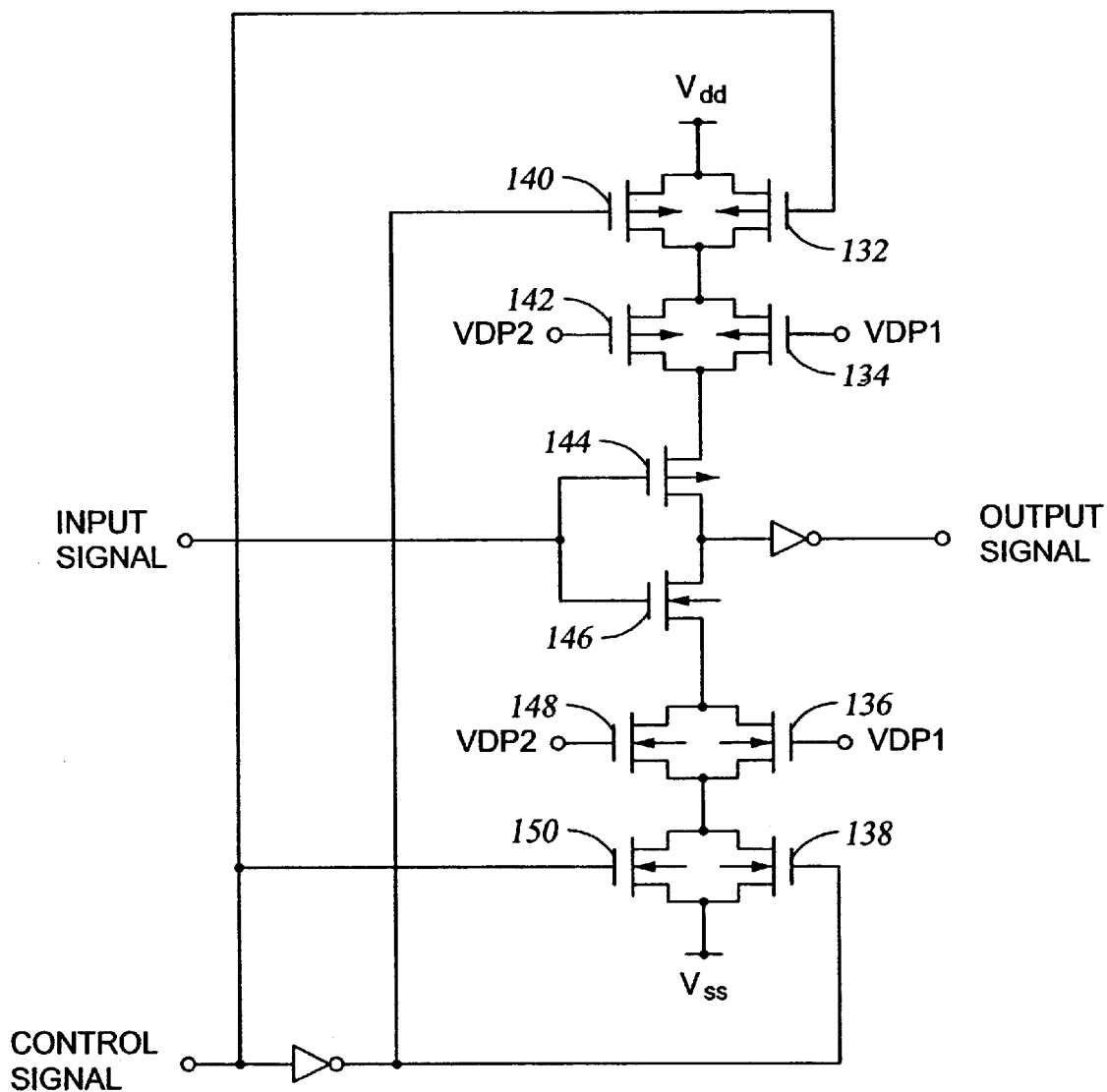
FIG. 15 shows a circuit diagram of a drive-impedance-control-type variable delay element 74.

FIG. 15 shows a circuit diagram of a drive-impedance-control-type variable delay element 74. The drive-impedance-control-type variable delay element 74 has transistors (132, 134, 136, 138, 140, 142, 144, 146, 148, and 150) and inverters 152 and 154. The drive-impedance-control-type variable delay element 74 can select the impedance set by the control signal VDP1 and VDN1 or the impedance set by the control signal VDP2 and VDN2 based on the truth value provided from the terminal CONT.

In a case where the truth value of "0" is provided from the terminal CONT, the drive-impedance-control-type variable delay element 74 generates a delay amount by the impedance set by the control signal VDN1 and the control signal VDP1. With an increase of the electric potential of the control signal VDN1, and/or a decrease of the electric potential of the control signal VDP1, the drive impedance decreases, and the delay amount to be generated decreases. Furthermore, with a decrease of the electric potential of the control signal VDN1, and/or an increase of the electric potential of the control signal VDP1, the drive impedance increases, and the delay amount to be generated increases.

In a case where the truth value of "1" is provided from the terminal CONT, the drive-impedance-control-type variable delay element 74 generates a delay amount by the impedance set by the control signal VDN2 and the control signal VDP2. With an increase of the electric potential of the control signal VDN2 and with a decrease of the electric potential of the control signal VDP2, the drive impedance decreases, and the delay amount to be generated decreases. Furthermore, with a decrease of the electric potential of the control signal VDN2, and/or an increase of the electric potential of the control signal VDP2, the drive impedance increases, and the delay amount to be generated increases.

In the above, although the present invention has been described with reference to specific embodiments, the technical scope of the present invention is not limited to the scope of the description of the above mentioned embodiments. It is clear for those skilled in the art that various modifications and improvements can be made to the above mentioned embodiments. It is clear from the scope of claims that the embodiments on which such modifications or improvements are made are also covered by the technical scope of the present invention.

Possibility for Use in Industry

It is clear from the above description that a desired delay amount can be generated according to the present invention.

What is claimed is:

1. A variable delay circuit for generating a desired delay amount, comprising:
   a delay compensation unit, which has a plurality of referential delay units that include different numbers of first variable delay elements, the delay amount of which varies based on a control signal, and the delay compensation unit generates each of a plurality of said control signals, which are provided to said first variable delay elements included in each of said plurality of referential delay elements, according to a number of said first variable delay elements included in each of said plurality of referential delay units; and
   a delay unit for generating said desired delay amount by controlling a plurality of second variable delay elements, which have a same characteristic with said first variable delay elements, by said plurality of control signals.

2. A variable delay circuit as claimed in claim 1, wherein said referential delay unit includes: a first referential delay unit which has M numbers (M is a natural number) of said variable delay elements; and a second referential delay unit that has N numbers (N is a natural number) of said first variable delay elements, the numbers of which are different to the numbers of said first variable delay elements included in said first referential delay unit; and
   said delay compensation unit has: a first delay compensation unit that generates said control signal provided to said first variable delay elements included in said first referential delay unit; and a second delay compensation unit that generates said control signal provided to said first variable delay element included in said second referential delay unit.

3. A variable delay circuit as claimed in claim 1 or 2, wherein:
   said referential delay unit has a ring oscillator that has different numbers of said first variable delay elements and generates a predetermined period of an oscillation clock according to the numbers of said first variable delay elements.

4. A variable delay circuit as claimed in claim 1, wherein said delay compensation unit further has:
   a phase comparator that compares a phase of a referential clock having a predetermined period with a phase of a delay clock, which is obtained by delaying said referential clock by said first variable delay elements; and
   a control signal generating unit which generates said control signal based on said comparison and outputs said control signal to said delay compensation unit and said delay unit.

5. A variable delay circuit as claimed in claim 4, wherein said control signal generating unit generates said control signal so that a phase of said referential clock and a phase of said delay clock matches.

6. A variable delay circuit as claimed in claim 1, wherein the variable delay circuit further comprises a selector which selects any one of a plurality of said control signals provided from said delay compensation and provides said selected control signal unit to said second variable delay elements.

7. A variable delay circuit as claimed in claim 1, wherein said first variable delay element has a capacitor having a predetermined capacitance and a time constant control unit for changing a time constant of said capacitor and changes a delay amount according to said time constant.

8. A variable delay circuit as claimed in claim 7, wherein said time constant control unit has a transistor and changes a time constant of said capacitor by changing a gate voltage applied to said transistor.

9. A variable delay circuit which generates a desired delay amount for a signal to be output to an output terminal, comprising:
   a variable delay element that has a capacitor having a predetermined capacitance and a time constant control unit, which is serially inserted between said capacitor and said output terminal for changing a time constant of said capacitor, and changes a delay amount according to said time constant; and
   a delay unit which generates said desired delay amount by selecting said variable delay elements based on said desired delay amount.

10. A variable delay circuit as claimed in claim 9, wherein said time constant control unit has a transistor and changes a time constant of said capacitor by changing a gate voltage applied to said transistor.

11. A delay signal generating method for generating a delay signal, which is obtained by delaying an input signal for a desired time, comprising:
- a step for generating a plurality of clocks by a plurality of referential delay units having different numbers of first variable delay elements, the delay amount of which changes, based on a control signal;
- a step for comparing each of the phases of a plurality of said clocks and a phase of a referential clock;
- a step for correcting each of said control signals corresponding to a plurality of said clocks according to corresponding said numbers of first variable delay elements based on said compared phase;
- a step for controlling each of said delay amounts of said first variable delay elements based on said corrected control signal; and
- a step for generating said delay signal, which is obtained by delaying said input signal for said desired time by controlling a plurality of second variable delay elements, which receives said control signal and is controlled based on said control signal and has a same characteristic with that of said first variable delay element, based on said corrected control signal.

12. A variable delay circuit for generating a desired delay amount, comprising:
- a first delay compensation unit for outputting a first control signal to generate said desired delay amount;
- a second delay compensation unit for outputting a second control signal to generate said desired delay amount; and
- a delay unit having a plurality of second variable delay elements for generating said desired delay amount by controlling said plurality of second variable delay elements by said first control signal and said second control signal output from said first delay compensation unit and said second delay compensation unit; wherein said first delay compensation unit includes:
- a first referential delay unit which has M numbers (M is a natural number) of first variable delay elements, the delay amount of which varies based on said first control signal;
- a first phase comparator that compares a phase of a referential clock having a predetermined period with a phase of a delay clock, which is obtained by delaying said referential clock by said first variable delay elements included in said first referential delay unit; and
- a first control signal generating unit which generates said first control signal based on said comparison performed by said first phase comparator and outputs said first control signal to said delay unit and said first referential delay unit according to a number of said first variable delay elements included in said first referential delay unit; and a second delay compensation unit includes:
- a second referential delay unit that has N numbers (N is a natural number) of first variable delay elements, said N numbers being different to said M numbers, the delay amount of said first variable delay elements varies based on said second control signal; and
- a second phase comparator which compares a phase of a referential clock having a predetermined period with a phase of a delay clock, which is obtained by delaying said referential clock by said first variable delay elements included in said second referential delay unit; and
- a second control signal generating unit which generates said second control signal based on said comparison performed by said second phase comparator and outputs said second control signal to said delay unit and said second referential delay unit according to a number of said first variable delay elements included in said second referential delay unit.

13. A variable delay circuit as claimed in claim 12, wherein each of said first referential delay unit and said second referential delay unit inputs same referential clock to delay said referential clock.

14. A variable delay circuit as claimed in claim 1, wherein said delay compensation unit has:
- a first differential amplifier circuit that amplifies a potential difference between an electric potential, which shows the phase difference between a referential clock and a delay clock delayed by said referential delay unit, and the referential potential to generate a first control signal and outputs said first control signal to said delay unit;
- a logical-threshold-value voltage generating unit for inputting said first control signal and generating a logical threshold voltage, which is a voltage determined according to said first control signal and a second control signal provided to said delay unit; and
- a second differential amplifier circuit which inputs said logical threshold voltage from said logical-threshold-value voltage generating unit and amplifies the potential difference between the referential potential and said logical threshold voltage to generate said second control signal and outputs said second control signal to said logical-threshold-value voltage generating unit and said delay unit.

* * * * *